(12) United States Patent
Kubouchi et al.

(10) Patent No.: US 11,830,782 B2
(45) Date of Patent: Nov. 28, 2023

(54) SEMICONDUCTOR DEVICE AND FABRICATION METHOD THEREOF

(71) Applicant: FUJI ELECTRIC CO., LTD., Kanagawa (JP)

(72) Inventors: Motoyoshi Kubouchi, Matsumoto (JP); Soichi Yoshida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 227 days.

(21) Appl. No.: 17/317,785

(22) Filed: May 11, 2021

(65) Prior Publication Data

US 2021/0265230 A1    Aug. 26, 2021

Related U.S. Application Data

(62) Division of application No. 16/589,111, filed on Sep. 30, 2019, now Pat. No. 11,049,785.

(30) Foreign Application Priority Data

Nov. 5, 2018 (JP) .................................. 2018-208430

(51) Int. Cl.
*H01L 23/34* (2006.01)
*H01L 27/06* (2006.01)
(Continued)

(52) U.S. Cl.
CPC ............ *H01L 23/34* (2013.01); *H01L 21/221* (2013.01); *H01L 27/0664* (2013.01);
(Continued)

(58) Field of Classification Search
CPC ............ H01L 23/34; H01L 2224/0603; H01L 27/0664; H01L 29/0623; H01L 21/221;
(Continued)

(56) References Cited

U.S. PATENT DOCUMENTS 9,379,181 B2    6/2016 Sugimoto
10,056,450 B2    8/2018 Kenji
(Continued)

FOREIGN PATENT DOCUMENTS

JP    2004363328 A    12/2004
JP    2008235405 A    10/2008
(Continued)

OTHER PUBLICATIONS

Office Action issued for counterpart Japanese Application No. 2018-208430, issued by the Japanese Patent Office dated Oct. 4, 2022 (drafted on Sep. 30, 2022).

(Continued)

*Primary Examiner* — Victor A Mandala

(57) ABSTRACT

In a semiconductor device, it is preferable to suppress a variation in characteristics of a temperature sensor. The semiconductor device is provided that includes a semiconductor substrate having a first conductivity type drift region, a transistor section provided in the semiconductor substrate, a diode section provided in the semiconductor substrate, a second conductivity type well region exposed at an upper surface of the semiconductor substrate, a temperature sensing unit that is adjacent to the diode section in top view and is provided above the well region, and an upper lifetime control region that is provided in the diode section, at the upper surface side of the semiconductor substrate, and in a region not overlapping with the temperature sensing unit in top view.

11 Claims, 17 Drawing Sheets

(51) Int. Cl.
  *H01L 29/06* (2006.01)
  *H01L 29/32* (2006.01)
  *H01L 29/40* (2006.01)
  *H01L 29/739* (2006.01)
  *H01L 29/10* (2006.01)
  *H01L 21/22* (2006.01)

(52) U.S. Cl.
  CPC ...... *H01L 29/0623* (2013.01); *H01L 29/1095* (2013.01); *H01L 29/32* (2013.01); *H01L 29/402* (2013.01); *H01L 29/7397* (2013.01)

(58) Field of Classification Search
  CPC ... H01L 29/32; H01L 29/402; H01L 29/7397; H01L 29/1095; H01L 29/0619; H01L 29/407; H01L 29/0696; H01L 27/0727; H01L 27/0629; G01K 13/00; G01K 7/01
  See application file for complete search history.

(56) References Cited

U.S. PATENT DOCUMENTS

| | | | |
|---|---|---|---|
| 10,794,773 | B2 | 10/2020 | Sato |
| 2006/0255361 | A1 | 11/2006 | Oyabe |
| 2012/0007142 | A1 | 1/2012 | Nagaoka |
| 2014/0319540 | A1* | 10/2014 | Sugimoto ........... H01L 29/0653 257/77 |
| 2015/0364541 | A1* | 12/2015 | Senoo ................... H01L 29/404 257/490 |
| 2016/0056144 | A1 | 2/2016 | Yao |
| 2016/0352211 | A1* | 12/2016 | Kameyama ......... H01L 29/1095 |
| 2017/0047321 | A1* | 2/2017 | Nishimura ............ H01L 29/861 |
| 2017/0229448 | A1* | 8/2017 | Tanaka ................ H01L 29/0649 |
| 2017/0236908 | A1* | 8/2017 | Naito .................... H01L 29/36 257/48 |
| 2019/0096989 | A1 | 3/2019 | Yoshida |

FOREIGN PATENT DOCUMENTS

| | | |
|---|---|---|
| JP | 2011134998 A | 7/2011 |
| JP | 2015185742 A | 10/2015 |
| JP | 2016012647 A | 1/2016 |
| JP | 2017147435 A | 8/2017 |
| WO | 2014199558 A1 | 12/2014 |
| WO | 2018110703 A1 | 6/2018 |

OTHER PUBLICATIONS

U.S. Appl. No. 16/589,111, filed Sep. 30, 2019, to Motoyoshi Kubouchi.

* cited by examiner

SEMICONDUCTOR DEVICE AND FABRICATION METHOD THEREOF

CROSS-REFERENCE TO RELATED APPLICATIONS

This application is a divisional of U.S. patent application Ser. No. 16/589,111, filed on Sep. 30, 2019, the entirety of which is incorporated herein by reference. The application also claims priority from the following Japanese patent application, which is explicitly incorporated herein by reference:

No. 2018-208430, filed in JP on Nov. 5, 2018.

BACKGROUND

1. Technical Field

The present invention relates to a semiconductor device and a fabrication method thereof.

2. Related Art

Conventionally, a technique of providing a temperature sensor on a semiconductor substrate in which a semiconductor element such as an insulated gate bipolar transistor (IGBT) is formed has been known (for example, see Patent Documents 1 to 3).

Patent Document 1: Japanese Patent Application, Publication No. 2017-147435
Patent Document 2: Japanese Patent Application, Publication No. 2008-235405
Patent Document 3: Japanese Patent Application, Publication No. 2016-12647

In a semiconductor device, it is preferable to suppress a variation in characteristics of a temperature sensor.

SUMMARY

To achieve the above object, in a first aspect of the present invention, a semiconductor device is provided that includes a semiconductor substrate having a first conductivity type drift region. The semiconductor device may include a transistor section provided in the semiconductor substrate. The semiconductor device may include a diode section provided in the semiconductor substrate. The semiconductor device may include a second conductivity type well region exposed at an upper surface of the semiconductor substrate. The semiconductor device may include a temperature sensing unit that is adjacent to the diode section in top view and is provided above a well region. The semiconductor device may include an upper lifetime control region that is provided in the diode section, an upper surface side of the semiconductor substrate, and in a region not overlapping with the temperature sensing unit in top view.

The temperature sensing unit may be sandwiched by the diode sections that are adjacent in top view.

In a second aspect of the present invention, a semiconductor device is provided that includes a semiconductor substrate having a first conductivity type drift region. The semiconductor device may include an active section including a transistor section and a diode section provided in the semiconductor substrate. The semiconductor device may include an edge termination structure that is provided in the semiconductor substrate and surrounds the active section in top view. The semiconductor device may include a second conductivity type well region exposed at an upper surface of the semiconductor substrate. The semiconductor device may include a temperature sensing unit that is provided between the active section and the edge termination structure in top view and is provided above the well region. The semiconductor device may include an upper lifetime control region that is provided in the diode section, in the upper surface side of the semiconductor substrate, and in a region not overlapping with a temperature sensing unit in top view.

A distance between the temperature sensing unit and the upper lifetime control region in top view may be 90 μm or less.

The upper lifetime control region is provided in a region not overlapping with the well region in top view.

The transistor section and the diode section may include a trench portion that extends from a surface of the semiconductor substrate into the semiconductor substrate. A portion of the trench portion may be provided inside the well region.

The diode section may include a second conductivity type cathode region that is provided inside the semiconductor substrate and is exposed at a lower surface of the semiconductor substrate. An end of the upper lifetime control region may be disposed between the cathode region and the temperature sensing unit in top view.

In a third aspect of the present invention, a semiconductor device is provided that includes a semiconductor substrate having a first conductivity type drift region. The semiconductor device may include a transistor section provided in the semiconductor substrate. The semiconductor device may include a diode section provided in the semiconductor substrate. The semiconductor device may include a second conductivity type well region exposed at an upper surface of the semiconductor substrate. The semiconductor device may include a temperature sensing unit provided above a well region. The semiconductor device may include an upper lifetime control region that is provided in the diode section and in the upper surface side of the semiconductor substrate and has a distance of 90 μm or less with the temperature sensing unit in top view.

In a fourth aspect of the present invention, a semiconductor device is provided that includes a semiconductor substrate having a first conductivity type drift region. The semiconductor device may include a second conductivity type well region exposed at an upper surface of the semiconductor substrate. The semiconductor device may include a temperature sensing unit provided above a well region. The semiconductor device may include an upper lifetime control region that is provided in a region overlapping with the temperature sensing unit in top view and includes a lifetime killer. The temperature sensing unit may not include the lifetime killer.

In a fifth aspect of the present invention, a fabrication method of a semiconductor device is provided. The fabrication method includes forming a temperature sensing unit above the semiconductor substrate. The fabrication method may include forming a mask portion that masks the temperature sensing unit. The fabrication method may include forming an upper lifetime control region in a region not overlapping with the temperature sensing unit in top view by introducing a lifetime killer from an upper surface side of the semiconductor substrate.

In a sixth aspect of the present invention, a fabrication method of a semiconductor device is provided. The fabrication method may include forming an upper lifetime control region by introducing a lifetime killer from an upper surface side of a semiconductor substrate. The fabrication method may include providing a temperature sensing unit above the semiconductor substrate and forming the temperature sensing unit at a position overlapping with the upper lifetime control region.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described with reference to embodiments of the invention. However, the following embodiments should not to be construed as limiting the claimed invention. Moreover, all the features of the combinations described in the embodiments are not necessarily essential as means for solving the problems of the invention.

In this specification, one side in a direction parallel to the depth direction of a semiconductor substrate is referred to as an "upper" side, and the other side is referred to as a "lower" side. One of two principal surfaces of a substrate, a layer or some other member is referred to as an upper surface, and the other surface is referred to as a lower surface. The "upper" and "lower" directions are not limited to the gravitational direction.

In each embodiment, there is shown an example where a first conductivity type is n type (which may be denoted as 'N type') and a second conductivity type is p type (which may be denoted as 'P type'); however, the first conductivity type may be p type, and the second conductivity type may be n type. In this case, conductivity-types of substrates, layers, regions and the like in each embodiment have opposite polarities, individually. The N+ type (or P+ type) indicates having a higher doping concentration than the N type (or P-type) and the N-type (or P-type) indicates having a lower doping concentration than the N type (or P-type).

In this specification, technical matters may be described using orthogonal coordinate axes of X axis, Y axis and Z axis. In this specification, the X-Y plane is defined as a plane parallel to the upper surface of a semiconductor substrate, and Z-axis is defined to be along a depth direction perpendicular to the upper surface of the semiconductor substrate.

In this specification, doping concentration refers to the concentration of impurities acting as donors or acceptors. In this specification, the difference in concentration of donors and acceptors may be defined as a doping concentration. Also, when a doping concentration distribution in a doped region has a peak, the peak value may be defined as the doping concentration in the doping region. For instance, in a case where the doping concentration in the doped region is approximately uniform, an average value of the doping concentration in the doping region may be defined as the doping concentration.

Figure 1:
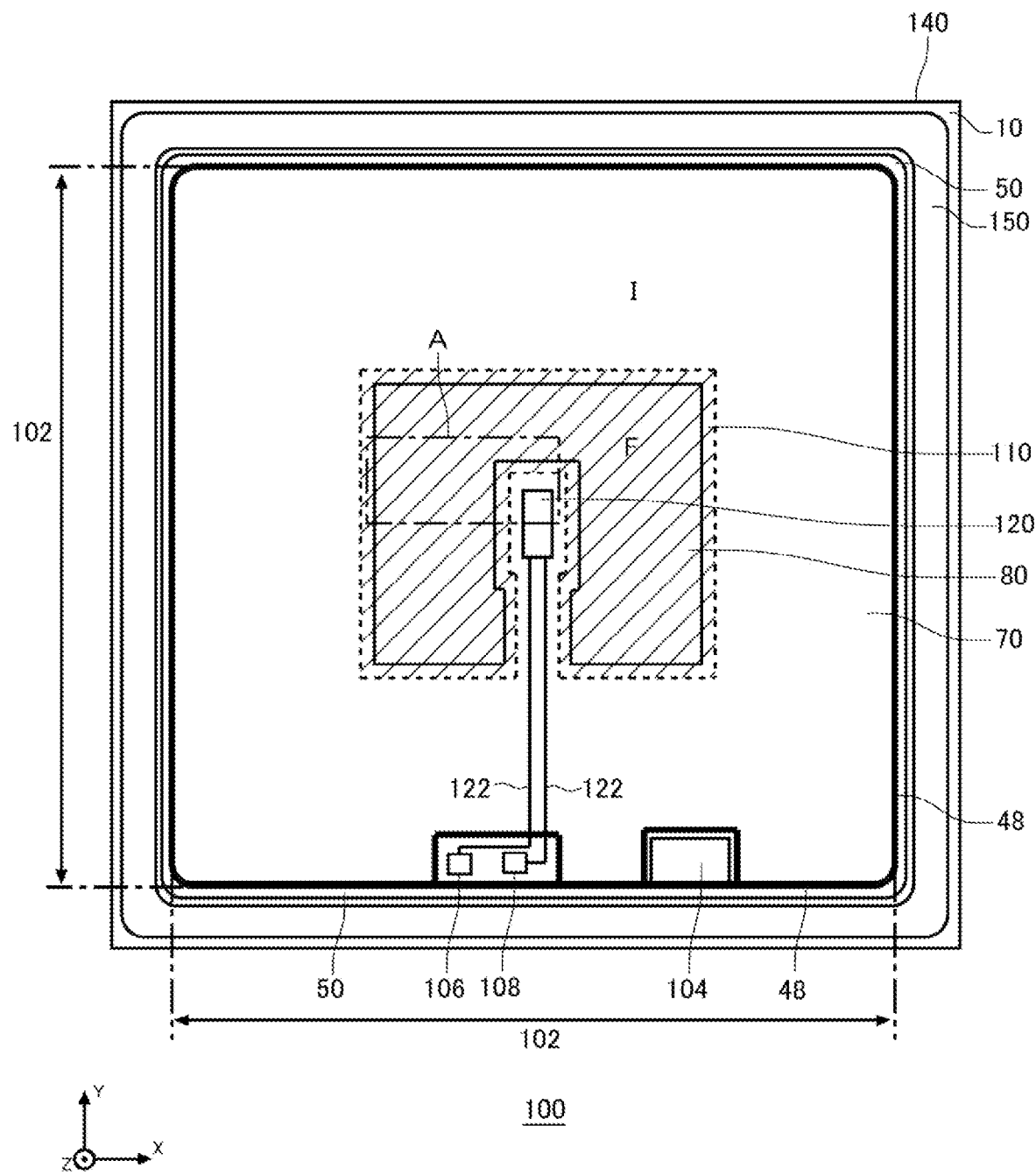
FIG. 1 illustrates a structure of an upper surface of a semiconductor device 100 according to an embodiment of the present invention.

FIG. 1 illustrates a structure of an upper surface of a semiconductor device 100 according to one embodiment of the present invention. The semiconductor device 100 includes a semiconductor substrate 10. The semiconductor substrate 10 may be a silicon substrate, a silicon carbide substrate, or a nitride semiconductor substrate such as gallium nitride. The semiconductor substrate 10 of the present example is a silicon substrate. In this specification, an end of the outer periphery of the semiconductor substrate 10 in top view is referred to as an outer peripheral end 140. The top view refers to a view of the semiconductor device 100 as seen from above the upper surface of the semiconductor substrate 10 in the direction perpendicular to the upper surface (Z-axis direction).

The semiconductor device 100 includes an active section 102, a temperature sensing unit 120, a temperature sensing wire 122, an upper lifetime control region 110, a gate metal layer 50, a gate runner 48, and an edge termination structure 150. The active section 102 is a region in which a main current flows between the upper surface and a lower surface of the semiconductor substrate 10 when the semiconductor device 100 is controlled to be turned on. That is, the active section 102 is a region in which a current flows inside the semiconductor substrate 10 from the upper surface to the lower surface or from the lower surface to the upper surface of the semiconductor substrate 10 in a depth direction. The active section 102 may be a region surrounded by the gate metal layer 50. The active section 102 may be a region covered by an emitter electrode described later. Further, a region sandwiched by the regions covered by the emitter electrode in top view may also be the active section 102. However, the region provided with each pad may be excluded from the active section 102. The active section 102 is provided with semiconductor elements such as transistors and diodes.

At least a portion of the gate metal layer 50 is provided between the active section 102 and the outer peripheral end 140 in a plane parallel to the upper surface of the semiconductor substrate 10. The gate metal layer 50 is formed of metal and supplies a gate voltage to an element provided to the active section 102. The gate metal layer 50 is formed above the semiconductor substrate 10 and is insulated from the semiconductor substrate 10 through an insulating film. The gate metal layer 50 may be disposed to surround the active section 102 on the plane parallel to the upper surface of the semiconductor substrate 10. The gate metal layer 50 is electrically connected to a gate pad 104. In top view, the gate pad 104 may be provided in the region surrounded by the gate metal layer 50 or may be disposed between the gate metal layer 50 and the outer peripheral end 140. Pads such as an anode pad 106 and a cathode pad 108 which are connected to the temperature sensing unit 120 may be provided in the region surrounded by the gate metal layer 50 or between the gate metal layer 50 and the outer peripheral end 140.

The gate runner 48 electrically connects the gate metal layer 50 and the element provided in the active section 102. The gate runner 48 may be formed of a semiconductor such as polysilicon doped with impurities. The gate runner 48 is formed above the semiconductor substrate 10 and is insulated from the semiconductor substrate 10 through the insulating film. The gate runner 48 may be provided along the gate metal layer 50. The gate runner 48 of the present example is provided to surround the active section 102 in top view. At least a portion of the gate runner 48 may overlap with the gate metal layer 50 in top view. As one example, an interlayer dielectric film is provided between the gate runner 48 and the gate metal layer 50, and the gate runner 48 is electrically connected to the gate metal layer 50 via a contact hole provided to the interlayer dielectric film. In each figure, the gate runner 48 is indicated by a thick solid line.

The gate runner 48 may also be disposed in the region overlapping with the active section 102. For example, the gate runner 48 may be provided across the active section 102 in top view. By virtue of the gate runner 48 in the region overlapping with the active section 102, it is possible to supply the gate voltage having a small delay and a small voltage drop to a region apart from the gate metal layer 50. Further, the gate runner 48 may be provided to surround the pads such as the gate pad 104 in top view.

The active section 102 includes the transistor section 70 and the diode section 80. In each figure, the region of the transistor section 70 may be indicated by a symbol I and the region of the diode section 80 may be indicated by a symbol F. The transistor section 70 includes a transistor such as an IGBT. In the transistor section 70, a P+ type collector region is exposed at the lower surface of the semiconductor substrate 10, and unit structures each including an N+ type emitter region and a MOS gate structure are periodically formed on the upper surface of the semiconductor substrate 10. The diode section 80 includes a diode such as free wheel diode (FWD). In the diode section 80, an N+ type cathode region of is exposed at the lower surface of the semiconductor substrate 10.

The diode section 80 of the present example is disposed in the region sandwiched by the transistor sections 70 in top view. The diode section 80 may be surrounded by the transistor section 70 in top view. The active section 102 may include a P+ type well region. In this specification, even if a portion of the transistor section 70 surrounding the diode section 80 is replaced with the well region in top view, it is regarded that the diode section 80 is surrounded by the transistor section 70. That is, if the diode section 80 is surrounded by the transistor section 70 and the well region on the upper surface of the semiconductor substrate 10, it is also regarded that the diode section 80 is surrounded by the transistor section 70 in this specification.

The temperature sensing unit 120 is disposed above the semiconductor substrate 10 to detect the temperature of the semiconductor substrate 10. The temperature sensing unit 120 of the present example is a PN junction diode formed of a semiconductor material such as polysilicon. The temperature sensing unit 120 is connected to the anode pad 106 and the cathode pad 108 via the temperature sensing wire 122. The anode pad 106 and the cathode pad 108 of the present example are disposed between the end of the active section 102 and the outer peripheral end 140. Thus, the temperature sensing wire 122 extends toward the end of the active section 102 from the temperature sensing unit 120 and is connected to the anode pad 106 and the cathode pad 108 that are disposed outside the end of the active section 102. The temperature sensing wire 122 may be a metal wire disposed above the semiconductor substrate 10 or may be a semiconductor wire such as polysilicon. The P+ type well region may be disposed in the region of the semiconductor substrate 10 overlapping with the temperature sensing unit 120 and the temperature sensing wire 122 in top view.

The temperature sensing unit 120 is adjacent to the diode section 80 in top view. The temperature sensing unit 120 being adjacent to the diode section 80 indicates that the transistor section 70 is not provided between the temperature sensing unit 120 and the diode section 80 in top view. When the N+ type emitter region is not provided between the temperature sensing unit 120 and the diode section 80, the temperature sensing unit 120 may be regarded as being adjacent to the diode section 80. The well region may be disposed between the temperature sensing unit 120 and the diode section 80 in top view.

The temperature sensing unit 120 of the present example is sandwiched between the diode sections 80 that are adjacent in the X-axis direction in top view. The temperature sensing unit 120 may be surrounded by the diode sections 80 that are adjacent in top view. In this specification, it is assumed that the temperature sensing unit 120 is surrounded by the diode section 80 even if a portion of the diode section 80 surrounding the circumference of the temperature sensing unit 120 is replaced with the well region in top view. That is, a state where the temperature sensing unit 120 is surrounded by the diode section 80 and the well region on the upper surface of the semiconductor substrate 10 is also assumed that the temperature sensing unit 120 is surrounded by the diode section 80 in this specification. The temperature sensing unit 120 of the present example is surrounded by the well region below the temperature sensing wire 122 and the diode section 80. Further, the diode section 80 of the present example is surrounded by the well region below the temperature sensing wire 122 and the transistor section 70.

The edge termination structure 150 is provided between the active section 102 and the outer peripheral end 140 of the semiconductor substrate 10 on the upper surface of the semiconductor substrate 10. The edge termination structure 150 of the present example is provided between the gate metal layer 50 and the outer peripheral end 140. The edge termination structure 150 may be disposed annularly to surround the active section 102 on the upper surface of the semiconductor substrate 10. The edge termination structure 150 of the present example is disposed along the outer peripheral end 140 of the semiconductor substrate 10. The edge termination structure 150 relaxes electric field concentration on the upper surface side of the semiconductor substrate 10. The edge termination structure 150 includes, for example, a guard ring, a field plate, a resurf and a structure obtained by combining these.

The upper lifetime control region 110 is provided in the diode section 80 and on the upper surface side of the semiconductor substrate 10. The upper surface side of the semiconductor substrate 10 may indicate the region that is above the center of the semiconductor substrate 10 in the depth direction. Further, when lifetime control regions are provided at different depth positions of the semiconductor substrate 10, the uppermost lifetime control region may be regarded as the upper lifetime control region 110.

The upper lifetime control region 110 is a region in which a lifetime killer is intentionally introduced by implanting impurities to the interior of the semiconductor substrate 10 or the like. A lifetime value of a carrier of an electron or a hole in the region to which the lifetime killer is intentionally introduced is smaller than the lifetime of a carrier in the region to which the lifetime killer is not intentionally introduced. The lifetime killer may be a carrier recombination center, a crystal defect, a vacancy in divacancy, a dangling bond formed by a vacancy or the like, a defect complex formed by any of the above and an element constituting the semiconductor substrate 10, a disposition, a noble gas element such as helium and neon, a hydrogen element or the like. By providing the upper lifetime control region 110 in the diode section 80, it is possible to adjust the carrier lifetime in the diode section 80 and reduce the loss during reverse recovery. The upper lifetime control region 110 may be formed by electron beam irradiation. The electron beam irradiation, due to its strong penetrating power, results in a substantially uniform distribution of lifetime killers from the upper surface to the lower surface of the semiconductor substrate 10, in either case of irradiation from the upper surface or from the lower surface. However, if an arbitrary position on the upper surface side is considered as the upper lifetime control region 110, the same argument as another lifetime killer holds. In this specification, the implantation and irradiation of particles for forming the lifetime killer may be expressed as the implantation and irradiation of the lifetime killer.

The upper lifetime control region 110 may be provided in the entire portion of the diode section 80 or in a portion of the diode section 80 in top view. In FIG. 1, the region in which the upper lifetime control region 110 is indicated with hatch lines. In the example of FIG. 1, the upper lifetime control region 110 is provided in the entire diode section 80. The upper lifetime control region 110 is provided in the region not overlapping with the temperature sensing unit 120 in top view. The upper lifetime control region 110 may be provided between the diode section 80 and the temperature sensing unit 120 in top view. Further, the upper lifetime control region 110 may be provided in at least a portion of the transistor section 70. In the example of FIG. 1, although the upper lifetime control region 110 is provided at a portion of the transistor section 70 adjacent to the diode section 80, in another example, the upper lifetime control region 110 may be provided in a larger area of the transistor section 70. For example, the upper lifetime control region 110 may be provided in the entire transistor section 70. By providing the upper lifetime control region 110 also in the transistor section 70, it is possible to suppress the flow of the holes from the base region 14 of the transistor section 70 to the cathode region 82 of the diode section 80 during reverse recovery of the diode section 80 and reduce the reverse recovery loss.

As one example, the upper lifetime control region 110 is formed by irradiating the semiconductor substrate 10 with lifetime killers such as helium or proton from the upper surface. By disposing the upper lifetime control region 110 so as not to overlap with the temperature sensing unit 120, the temperature sensing unit 120 is suppressed from being irradiated with lifetime killers such as helium in forming the upper lifetime control region 110. Thus, it is possible to suppress the variation in characteristics of the temperature sensing unit 120 by suppressing the implantation of lifetime killers into the temperature sensing unit 120. In the present example, since the diode section 80 is provided adjacent to the temperature sensing unit 120, it is possible to accurately detect the temperature of the diode section 80 at the time of the operation. Further, by providing the upper lifetime control region 110 to the diode section 80, it is possible to adjust the carrier lifetime in the diode section 80 and suppress the implantation of the lifetime killer into the temperature sensing unit 120 adjacent to the diode section 80, and thus, the variation in characteristics of the temperature sensing unit 120 can also be suppressed.

Figure 2:
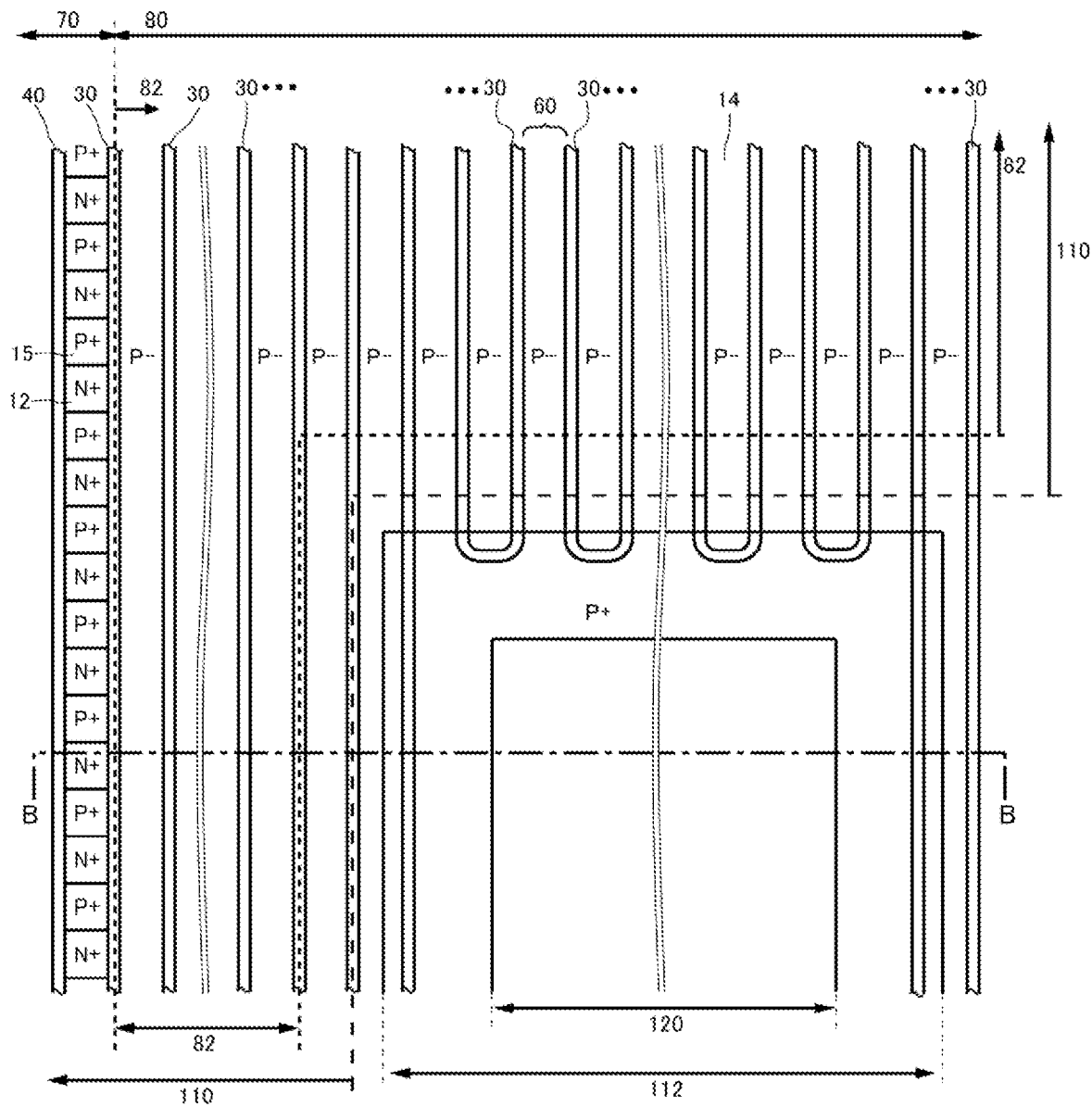
FIG. 2 is a top view obtained by enlarging a region A of FIG. 1.

FIG. 2 is top view obtained by enlarging a region A of FIG. 1. The region A contains a portion of transistor section 70, a portion of diode section 80, and a portion of the temperature sensing unit 120. The semiconductor device 100 of the present example includes a gate trench portion 40, a dummy trench portion 30, a well region 112, an emitter region 12, a base region 14, and a contact region 15 formed inside and on the semiconductor substrate 10. The interlayer dielectric film is provided above the semiconductor substrate 10 and the emitter electrode provided above the interlayer dielectric film are omitted in FIG. 2. The emitter electrode may, through the contact hole provided in the interlayer dielectric film, contact to an emitter region 12, a base region 14, a contact region 15, and a well region 112 on the upper surface of the semiconductor substrate 10. Further, the temperature sensing unit 120 is disposed above the interlayer dielectric film.

Metal parts such as the emitter electrode and the gate metal layer 50 may be formed of aluminum or aluminum-silicon alloy. In each electrode, a barrier metal formed of titanium, a titanium compound, or the like may be provided in a layer below the region formed of aluminum or the like and a plug formed of tungsten or the like may be provided in the contact hole.

The gate trench portion 40 is provided to extend in a predetermined extending direction on the upper surface of the semiconductor substrate 10. In the present example, the extending direction of each trench portion is parallel to the extending direction of the temperature sensing wire 122 (Y-axis direction). The gate trench portion 40 of the present example is longer in the Y-axis direction and shorter in the X-axis direction on the upper surface of the semiconductor substrate 10. The gate trench portion 40 includes a trench provided from the upper surface to the interior of the semiconductor substrate 10, a gate insulating film that covers the inner wall of the trench, and the gate electrode surrounded by the gate insulating film. The gate electrode in the gate trench portion 40 is connected to the gate runner 48 or the gate metal layer 50. The gate trench portion 40 is provided to extend to a position overlapping with the gate runner 48 or the gate metal layer 50 in top view.

The dummy trench portion 30 is provided to extend in a predetermined extending direction (Y-axis direction in the present example) on the upper surface of the semiconductor substrate 10. The dummy trench portion 30 of the present example is longer in the Y-axis direction and shorter in the X-axis direction on the upper surface of the semiconductor substrate 10. The dummy trench portion 30 includes the trench provided from the upper surface to the interior of the semiconductor substrate 10, a dummy insulating film that covers the inner wall of the trench, and a dummy electrode surrounded by the dummy insulating film. The dummy electrode in the dummy trench portion 30 is connected to the emitter electrode 52.

In the transistor section 70, one or more gate trench portions 40 are arrayed apart from one another along a widthwise direction of the gate trench portion 40 (X-axis direction in the present example). In this specification, the direction in which respective trench portions are arrayed may be referred to as an array direction. In the transistor section 70, one or more gate trench portions 40 and one or more dummy trench portions 30 may be disposed alternately along the array direction.

In the diode section 80, one or more dummy trench portions 30 are arrayed along the array direction. In this specification, the gate trench portion 40 and the dummy trench portion 30 may be collectively referred to as a trench portion. Further, the region of the semiconductor substrate 10 sandwiched between two trench portions in the array direction of the trench portion is referred to as a mesa portion 60. The mesa portion 60 may refer to a region having a depth that is the same as the depth from the upper surface of the semiconductor substrate 10 to the lower end of the trench portion. Each of the transistor section 70 and the diode section 80 includes one or more mesa portions 60.

The N+ type emitter region 12 is exposed at the upper surface of the mesa portion 60 of the transistor section 70. The emitter region 12 is provided in contact with the gate trench portion 40. The P+ type contact region 15 may be exposed at the upper surface of the mesa portion 60 of the transistor section 70. The emitter region 12 and the contact region 15 are connected to the emitter electrode via the contact hole provided in the interlayer dielectric film.

The contact region 15 may be in contact with or apart from at least one of the gate trench portion 40 and the dummy trench portion 30. In the mesa portion 60 of the transistor section 70 of the present example, the emitter region 12 and the contact region 15 are alternately disposed along the extending direction of the trench portion. In another example, the mesa portion 60 may have a stripe shape in which each of the emitter region 12 and the contact region 15 is longer in the extending direction of the trench portion. In this case, in top view, emitter regions 12 are provided at both ends of the mesa portion 60 in contact with respective trench portions, and the contact region 15 is provided to be sandwiched between the emitter regions 12.

The P-type base region 14 is exposed on the upper surface of the mesa portion 60 of the diode section 80. The base region 14 of the mesa portion 60 is connected to the emitter electrode via the contact hole provided in the interlayer dielectric film. The base region 14 of the diode section 80 functions as an anode region. The doping concentration of the above described contact region 15 is higher than the doping concentration of the base region 14. Further, in the mesa portion 60 of the transistor section 70, the base region 14 is provided below the emitter region 12 and the contact region 15.

The well region 112 is provided in the region of the semiconductor substrate 10 below the temperature sensing unit 120. The entire temperature sensing unit 120 may be disposed at the position overlapping with the well region 112. The well region 112 may be provided in a larger area than the temperature sensing unit 120 in top view.

The trench portion that does not face the well region 112 in the extending direction of the trench portion (Y-axis direction in the present example) may extend in the Y-axis direction in parallel with the temperature sensing unit 120 and the temperature sensing wire 122. The end of the trench portion facing the well region 112 in the Y-axis direction may be provided at the position overlapping with the well region 112. In the present example, no trench portion is provided below the temperature sensing unit 120.

In FIG. 2, the area where the cathode region 82 is provided and the area where the upper lifetime control region 110 is provided are indicated by broken lines. The cathode region 82 of the diode section 80 may be provided apart from the well region 112 and the temperature sensing unit 120 in top view. As illustrated in FIG. 2, the transistor section 70 is not provided between the cathode region 82 and the temperature sensing unit 120 in top view. That is, the emitter region 12 is not provided between the cathode region 82 and the temperature sensing unit 120. Further, the gate trench portion 40 is also not provided between the cathode region 82 and the temperature sensing unit 120. Therefore, the temperature sensing unit 120 is adjacent to the diode section 80. The temperature sensing unit 120 of the present example is adjacent to the diode section 80 in both the X-axis direction and the Y-axis direction.

The upper lifetime control region 110 is overlapped with the entire cathode region 82 in top view. The upper lifetime control region 110 may be provided in the area wider than the cathode region 82 in top view. The upper lifetime control region 110 may also be provided between the well region 112 and the cathode region 82 in top view. However, the upper lifetime control region 110 may be provided in the area not overlapping with the well region 112 in top view. By providing the upper lifetime control region 110 to the vicinity of the well region 112, it is possible to suppress the implantation of the lifetime killer into the temperature sensing unit 120 while controlling the lifetime of the carrier in the wide area. In another example, the upper lifetime control region 110 may be provided to the position in contact with the well region 112 and may also be provided to the area overlapping with the well region 112.

Figure 3:
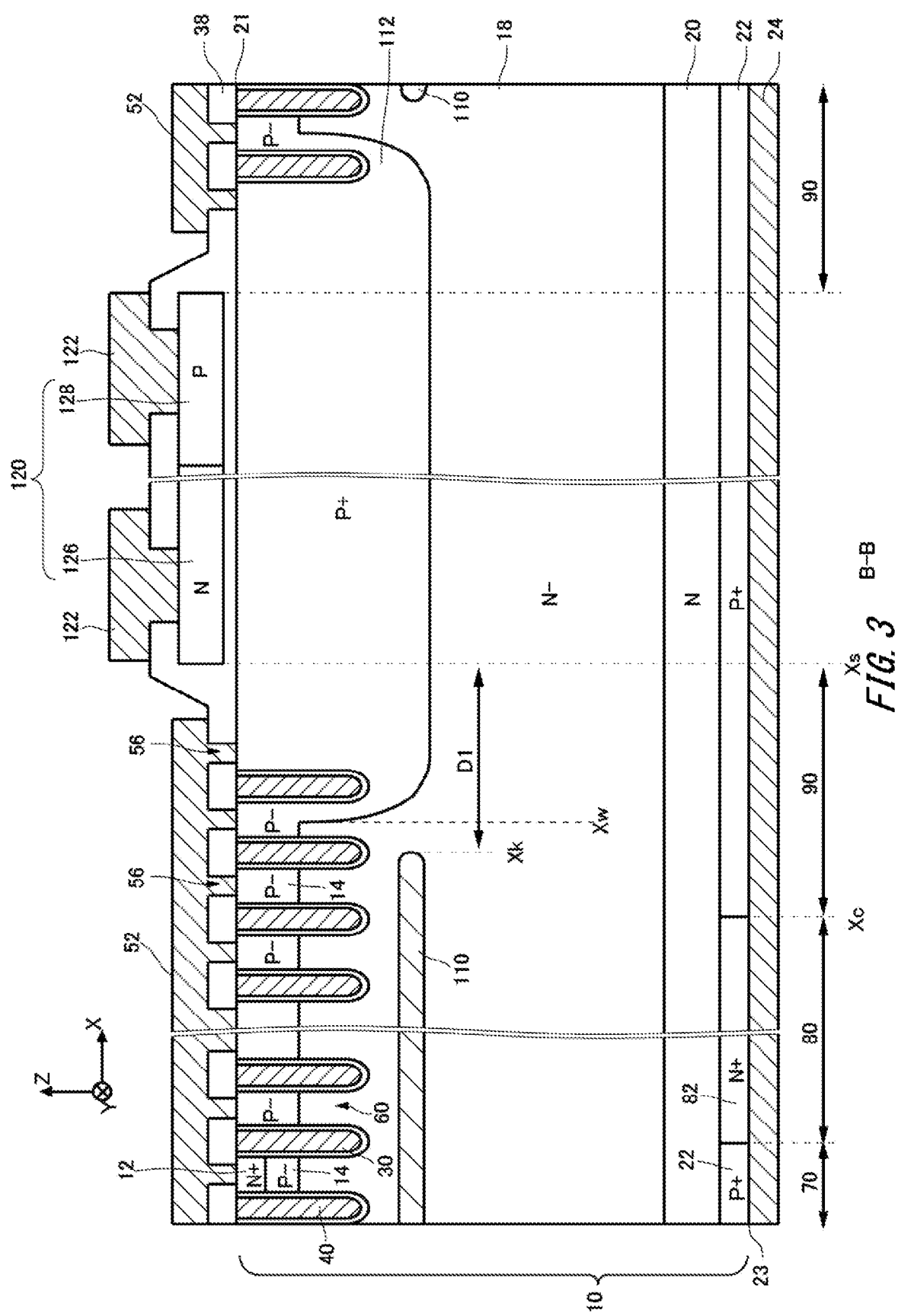
FIG. 3 illustrates one example of a cross section taken along B-B of FIG. 2.

FIG. 3 illustrates one example of a cross section taken along B-B of FIG. 2. The cross section B-B is an XZ plane passing through the temperature sensing unit 120, the diode section 80, and the transistor section 70. In the cross section, the semiconductor device 100 includes the semiconductor substrate 10, an interlayer dielectric film 38, an emitter electrode 52, a collector electrode 24, the temperature sensing unit 120, and the temperature sensing wire 122.

The semiconductor substrate 10 includes an upper surface 21 and a lower surface 23. The interlayer dielectric film 38 is formed to cover at least a portion of the upper surface 21 of the semiconductor substrate 10. A through hole such as contact hole 56 is formed in the interlayer dielectric film 38. The upper surface 21 of the semiconductor substrate 10 is exposed through the contact hole 56. The contact hole 56 may be provided for each of the mesa portions 60 of the transistor section 70 and the diode section 80. The interlayer dielectric film 38 may be silicate glass such as PSG or BPSG, may be an oxide film, a nitride film or the like, or may be a stack of such films.

The emitter electrode 52 is formed on the upper surfaces of the semiconductor substrate 10 and the interlayer dielectric film 38. The emitter electrode 52 is also formed inside the contact hole 56, and is in contact with the emitter region 12, the contact region 15 (refer to FIG. 2), and the base region 14 that are exposed through the contact hole 56. The emitter electrode 52 of the present example is not disposed in the region where the temperature sensing unit 120 is provided.

The collector electrode 24 is formed on the lower surface 23 of the semiconductor substrate 10. The collector electrode 24 may be in contact with the entire lower surface 23 of the semiconductor substrate 10. The emitter electrode 52 and the collector electrode 24 are formed of metal materials such as aluminum.

The temperature sensing unit 120 is provided above the upper surface 21 of the semiconductor substrate 10. The interlayer dielectric film 38 such as an oxide film is provided between the temperature sensing unit 120 and the upper surface 21 of the semiconductor substrate 10. The temperature sensing unit 120 of the present example is a PN junction diode including an N type region 126 and a P type region 128. Each of N type region 126 and P type region 128 may be connected to the temperature sensing wire 122.

Provided to the semiconductor substrate 10 of the present example are an N-type drift region 18, an N+ type emitter region 12, a P-type base region 14, a P+ type well region 112, an N+ type buffer region 20, an N+ type cathode region 82, and a P+ type collector region 22.

The emitter region 12 is provided in contact with the upper surface 21 of the semiconductor substrate 10 in the mesa portion 60 of the transistor section 70. The emitter region 12 has a higher doping concentration than the drift region 18. The emitter region 12 includes, for example, N-type impurities such as phosphorus.

The base region 14 is provided between the emitter region 12 and the drift region 18. The base region 14 includes, for example, P-type impurities such as boron. An N+ type accumulation region having a doping concentration higher than that of the drift region 18 may be provided between the base region 14 and the drift region 18.

The well region 112 is provided below the temperature sensing unit 120 and the temperature sensing wire 122. The well region 112 is a P+ type region having a higher doping concentration than the base region 14. The well region 112 may be exposed at the upper surface 21 of the semiconductor substrate 10. The well region 112 may be provided to a deeper position than the base region 14. In the present example, while the base region 14 is provided to a position shallower than the lower end of the trench portion, the well region 112 is provided to a position deeper than the lower end of the trench portion. The well region 112 may also be provided below the gate metal layer 50 and the gate runner 48 illustrated in FIG. 1.

The collector region 22 is in contact with the lower surface 23 of the semiconductor substrate 10. The collector region 22 may have a higher doping concentration than the base region 14. The collector region 22 may contain the same P-type impurities as the base region 14 or may contain P-type impurities different from the base region 14.

The cathode region 82 is in contact with the lower surface 23 of the semiconductor substrate 10. The cathode region 82 has a higher doping concentration than the drift region 18. The buffer region 20 is provided between the collector region 22 and the drift region 18 and between the cathode region 82 and the drift region and has one or more doping concentration peaks, and the doping concentration peaks have higher donor concentration than the drift region 18. The buffer region 20 includes N-type impurities such as hydrogen. The buffer region 20 may function as a field stop layer that suppresses a depletion layer extending from the lower surface side of the base region 14 from reaching the collector region 22.

The gate trench portion 40 extends from the upper surface 21 of the semiconductor substrate 10 to the drift region 18 by passing through the emitter region 12 and the base region 14. The gate trench portion 40 includes a trench formed on the upper surface 21 of the semiconductor substrate 10, a gate insulating film that covers the inner wall of a trench, and the gate electrode surrounded by the gate insulating film. In FIG. 3, the gate electrode is indicated with hatch lines. The gate electrode is formed of conductive material such as polysilicon.

The gate electrode includes a region facing the base region 14. While the gate trench portion 40 is covered by the interlayer dielectric film 38 on the upper surface 21 of the semiconductor substrate 10 in the cross section, the gate electrode is connected to the gate runner 48 or the gate metal layer 50 in another cross section. When a predetermined gate voltage is applied to the gate electrode, a channel of an inversion layer of electrons is formed on a surface layer of an interface where the base region 14 and the gate trench portion 40 are in contact with each other.

The dummy trench portion 30 extends from the upper surface 21 of the semiconductor substrate 10 to the drift region 18 by passing through the base region 14. The dummy trench portion 30 provided in the transistor section 70 also passes through the emitter region 12. The dummy trench portion 30 includes the trench formed on the upper surface 21 of the semiconductor substrate 10, the dummy insulating film that covers the inner wall of the trench, and the dummy electrode surrounded by the dummy insulating film. In FIG. 3, the dummy electrode is indicated with hatch lines. The dummy electrode is formed of the conductive material such as polysilicon.

While the dummy trench portion 30 is covered by the interlayer dielectric film 38 on the upper surface 21 of the semiconductor substrate 10 in the cross section, the dummy electrode is connected to the emitter electrode 52 in another cross section. By providing the dummy trench portion 30 connected to an emitter potential, the gate-collector capacitance of the semiconductor device 100 can be reduced.

In the transistor section 70, the collector region 22 is provided in contact with the lower surface 23 of the semiconductor substrate 10. Thereby, holes are injected from the collector region 22 and a conductivity modulation is applied to the drift region 18 of the transistor section 70. The transistor section 70 includes the gate trench portion 40 and the dummy trench portion 30. Further, the emitter region 12 and the base region 14 are provided in the mesa portion 60 of the transistor section 70.

In the diode section 80, the cathode region 82 is provided in contact with the lower surface 23 of the semiconductor substrate 10. Further, below the well region 112, the collector region 22 is provided in contact with the lower surface 23 of the semiconductor substrate 10. Thereby, a withstand voltage can be increased by increasing the distance between the cathode region 82 and the well region 112 provided to a deep position. Further, the diode section 80 includes the dummy trench portion 30. The base region 14 is provided to the mesa portion 60 of the diode section 80. The collector region 22 may be provided in a region that is adjacent to the lower surface 23 of the semiconductor substrate 10 and in which the cathode region 82 is not provided. In the present example, the collector region 22 is provided in the region overlapping with the well region 112 and the region overlapping with the temperature sensing unit 120. Further, the collector region 22 is provided also in the region between the diode section 80 and the temperature sensing unit 120 in top view.

In this specification, the region between the diode section 80 and the temperature sensing unit 120 in top view in the active section 102 is referred to as a boundary region 90. In the boundary region 90, the collector region 22 is provided on the lower surface 23 of the semiconductor substrate 10.

In the boundary region 90, neither the emitter region 12 nor the gate trench portion 40 is provided. In the present example, although the boundary region 90 is provided between the diode section 80 and the temperature sensing unit 120, the transistor section 70 is not provided between the diode section 80 and the temperature sensing unit 120, and therefore the diode section 80 and the temperature sensing unit 120 are adjacent to each other. The well region 112 is provided in a part of the boundary region 90. The well region 112 of the boundary region 90 may be continuous with the well region 112 of the temperature sensing unit 120. The boundary region 90 may include the dummy trench portion 30. In the boundary region 90, at least one dummy trench portion 30 may be disposed inside the well region 112. The mesa portion 60 of the boundary region 90 may include the base region 14. Further, the interlayer dielectric film 38 of the boundary region 90 may include the contact hole 56 for connecting the emitter electrode 52 and the well region 112. By providing the contact hole 56, it is possible to extract the holes also from the well region 112 when the semiconductor device 100 is turned off or the like.

The upper lifetime control region 110 may be provided in at least a portion of the boundary region 90. The upper lifetime control region 110 of the boundary region 90 is continuous with the upper lifetime control region 110 of the diode section 80. By providing the upper lifetime control region 110 also in the boundary region 90, it is possible to adjust the lifetime of the carrier in the region near the diode section 80. On the other hand, the upper lifetime control region 110 is provided at a position not overlapping with the temperature sensing unit 120 in top view. Accordingly, even if the irradiation with the lifetime killer is performed from the upper surface 21 side of the semiconductor substrate 10, it is possible to suppress the temperature sensing unit 120 from being irradiated with the lifetime killer Therefore, it becomes easy to perform the irradiation with the lifetime killer from the upper surface 21 side of the semiconductor substrate 10. Since the area of the lifetime killer becomes short compared to when the irradiation with the lifetime killer from the lower surface 23 side of the semiconductor substrate 10 is performed, it is possible to accurately control the position at which the upper lifetime control region 110 is formed.

In the present example, in the array direction of the trench portions (X-axis direction), the end position of the cathode region 82 closer to the temperature sensing unit 120 is defined as Xc, the end position of the upper lifetime control region 110 closer to the temperature sensing unit 120 is defined as Xk, the end position of the well region 112 closer to the position Xk is defined as Xw, and the end position of the temperature sensing unit 120 closer to the position Xw is defined as Xs.

The end position Xk of the upper lifetime control region 110 is between the end position Xc of the cathode region 82 and the end position Xs of the temperature sensing unit 120. The end position Xk of the upper lifetime control region 110 may be between the end position Xc of the cathode region 82 and the end position Xw of the well region 112. In another example, the end position Xk of the upper lifetime control region 110 may be between the end position Xw of the well region 112 and the end position Xs of the temperature sensing unit 120. The distance between the end position Xw of the well region 112 and the end position Xc of the cathode region 82 in the temperature sensing unit 120 side in the X-axis direction may at least be larger than the length of the drift region 18 from the lower end of the well region 112 to the upper end of the buffer region 20 in the Z-axis direction, may be preferably larger than the length in the Z-axis direction from the lower end of the well region 112 to the upper end of the collector region 22, and more preferably may be larger than the thickness of the semiconductor substrate 10.

The distance between the end position Xk of the upper lifetime control region 110 and the end position Xs of the temperature sensing unit 120 in top view may be 90 μm or less. By reducing the distance, the area where the upper lifetime control region 110 is provided can be enlarged. The distance may be 10 μm or more and may be 50 μm or more. By securing the distance, it is possible to suppress the temperature sensing unit 120 from being irradiated with the lifetime killer.

Further, the upper lifetime control region 110 may be provided above or below the lower end of the well region 112. The upper lifetime control region 110 is provided below the lower end of the trench portion. The depth position of the upper lifetime control region 110 is a position where the concentration distribution of the lifetime killer is at a peak in the depth direction.

Figure 4:
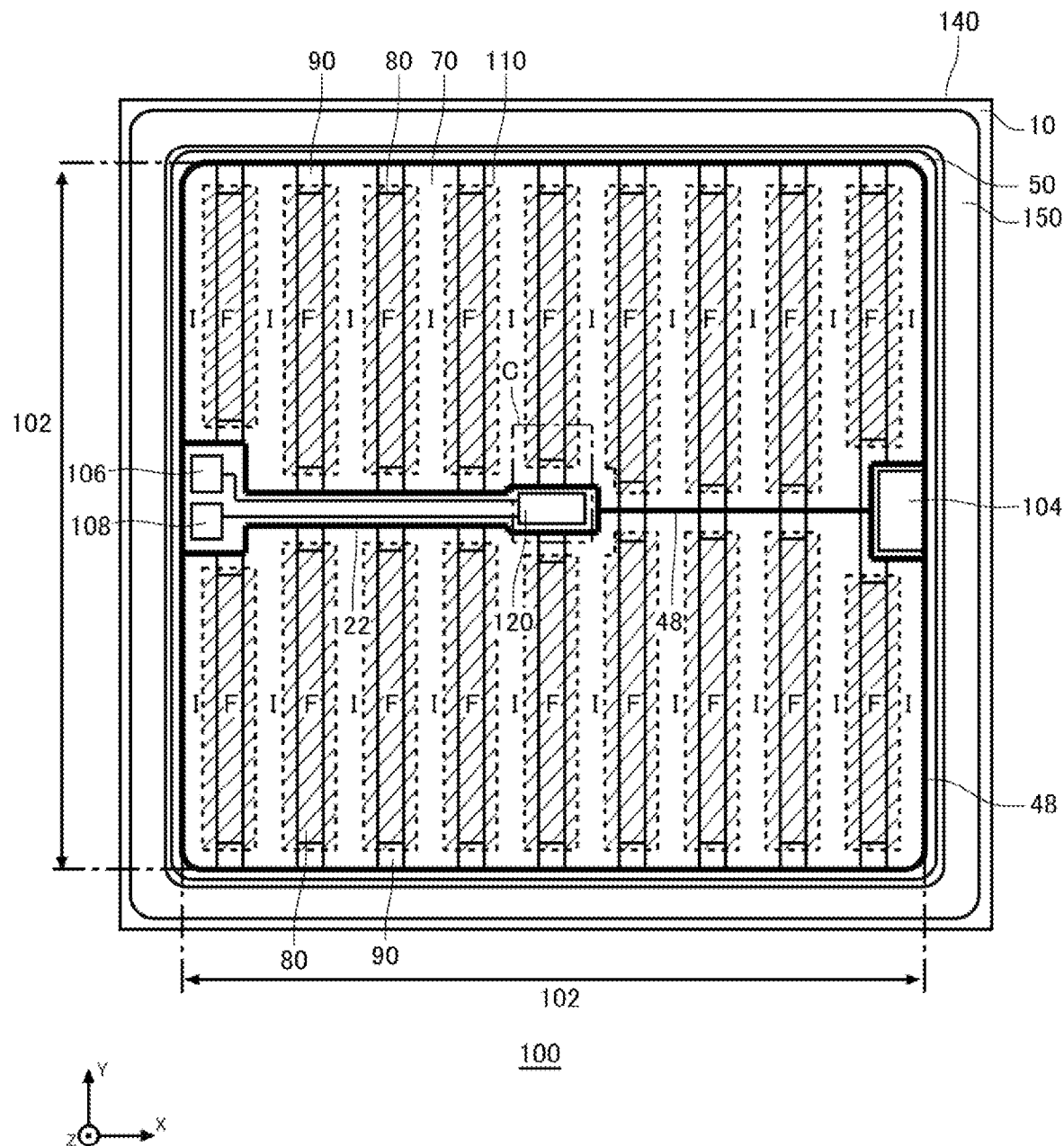
FIG. 4 illustrates another example of the upper surface structure of the semiconductor device 100.

FIG. 4 illustrates another example of an upper surface structure of a semiconductor device 100. Although the temperature sensing unit 120 of the present example is not surrounded by the diode section 80, the temperature sensing unit 120 is adjacent to the diode section 80 in top view. The temperature sensing unit 120 of the present example is adjacent to both the diode section 80 and the transistor section 70 in the Y-axis direction. The temperature sensing unit 120 may be longer in the X-axis direction. With such an arrangement, it is possible to accurately detect the temperature of the semiconductor substrate 10 during both of a period in which the transistor section 70 is in the ON state and a period in which the diode section 80 is in the ON state.

In the example of FIG. 4, transistor sections 70 and diode sections 80 are alternately disposed in the X-axis direction. Each of transistor sections 70 and diode sections 80 is longer in the Y-axis direction and is short in the X-axis direction. A boundary region 90 may be provided between the diode section 80 and the gate runner 48 (or gate metal layer 50) in the Y-axis direction.

The temperature sensing wire 122 of the present example extends from the temperature sensing unit 120 in the X-axis direction, and is connected to the anode pad 106 and the cathode pad 108. Further, the temperature sensing unit 120 and the temperature sensing wire 122 are surrounded by the gate runner 48 in top view. The gate runner 48 surrounding the temperature sensing unit 120 extends to the end of the active section 102 along the temperature sensing wire 122 in the direction toward the anode pad 106 and the cathode pad 108. Further, the gate pad 104 is disposed on the opposite side of the active section 102 from the anode pad 106 and the cathode pad 108. The gate runner 48 surrounding the temperature sensing unit 120 may extend to the end of the active section 102 in the direction toward the gate pad 104. The active section 102 may be divided into a plurality of portions by the gate runner 48 in the Y-axis direction. Each of the divided portions of the active section 102 may include transistor sections 70 and diode sections 80 alternately disposed along the X-axis direction.

Figure 5:
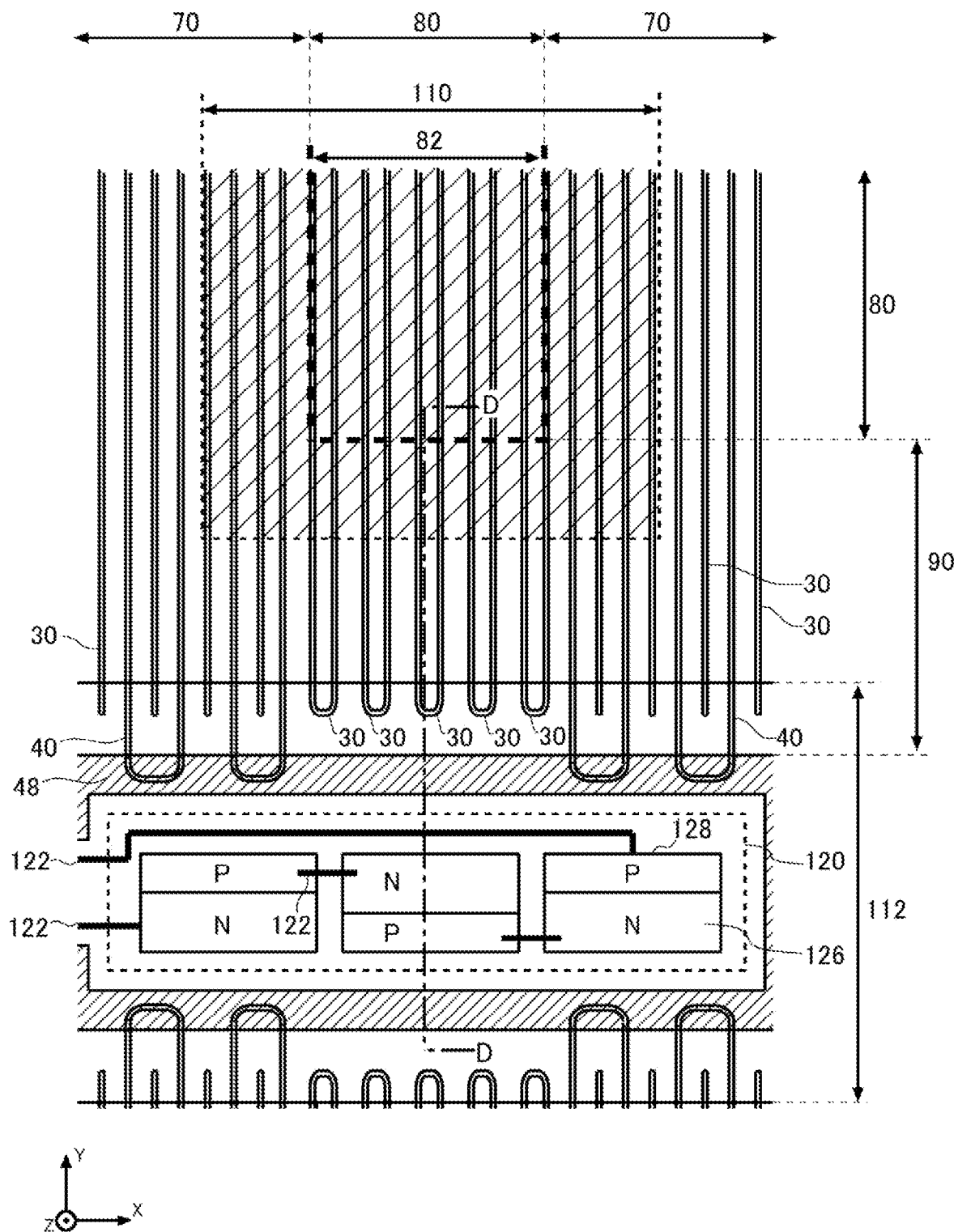
FIG. 5 is a top view obtained by enlarging a region C of FIG. 4.

FIG. 5 is a top view obtained by enlarging a region C in FIG. 4. In an enlarged view such as FIG. 5, the emitter region 12, the contact region 15, and the base region 14 on the upper surface of each mesa portion 60 may be omitted. The temperature sensing unit 120 and the temperature sensing wire 122 of the present example are surrounded by the gate runner 48 in top view. The gate runner 48 is provided between the temperature sensing unit 120 and the transistor section 70 and between the temperature sensing unit 120 and the diode section 80. The well region 112 is provided below the temperature sensing unit 120, the temperature sensing wire 122, and the gate runner 48. The well region 112 may be provided in an area wider than the gate runner 48.

The extending direction of the trench portion of the present example is a direction perpendicular to the extending direction of the temperature sensing wire 122 (Y-axis direction). The gate trench portion 40 of the transistor section 70 of the present example extends to the position overlapping with the gate runner 48 and thus is connected to the gate runner 48. Further, the dummy trench portion 30 of the transistor section 70 and the diode section 80 may extend to the position overlapping with the well region 112.

The cathode region 82 is apart from the temperature sensing unit 120 in the Y-axis direction. The cathode region 82 may be apart from the gate runner 48 and also may be apart from the well region 112 in the Y-axis direction.

The upper lifetime control region 110 is provided in the region overlapping with the diode section 80. The end of the upper lifetime control region 110 of the present example in the Y-axis direction is disposed between the temperature sensing unit 120 and the cathode region 82. Thereby, the area where the upper lifetime control region 110 is provided can be enlarged and it is possible to suppress the lifetime killer from being implanted to the temperature sensing unit 120. The end of the upper lifetime control region 110 in the X-axis direction is disposed in the transistor section 70.

The temperature sensing unit 120 of the present example includes a plurality of PN junctions each having the N type region 126 and the P type region 128. The individual PN junctions are connected in series via the temperature sensing wire 122. That is, the P type region 128 of a PN junction is connected to the N type region 126 of another PN junction. The plurality of PN junctions may be arrayed in the X-axis direction. At least one PN junction is provided at the position facing the diode section 80 in the Y-axis direction. At least one PN junction may be provided at the position facing the transistor section 70 in the Y-axis direction.

Figure 6:
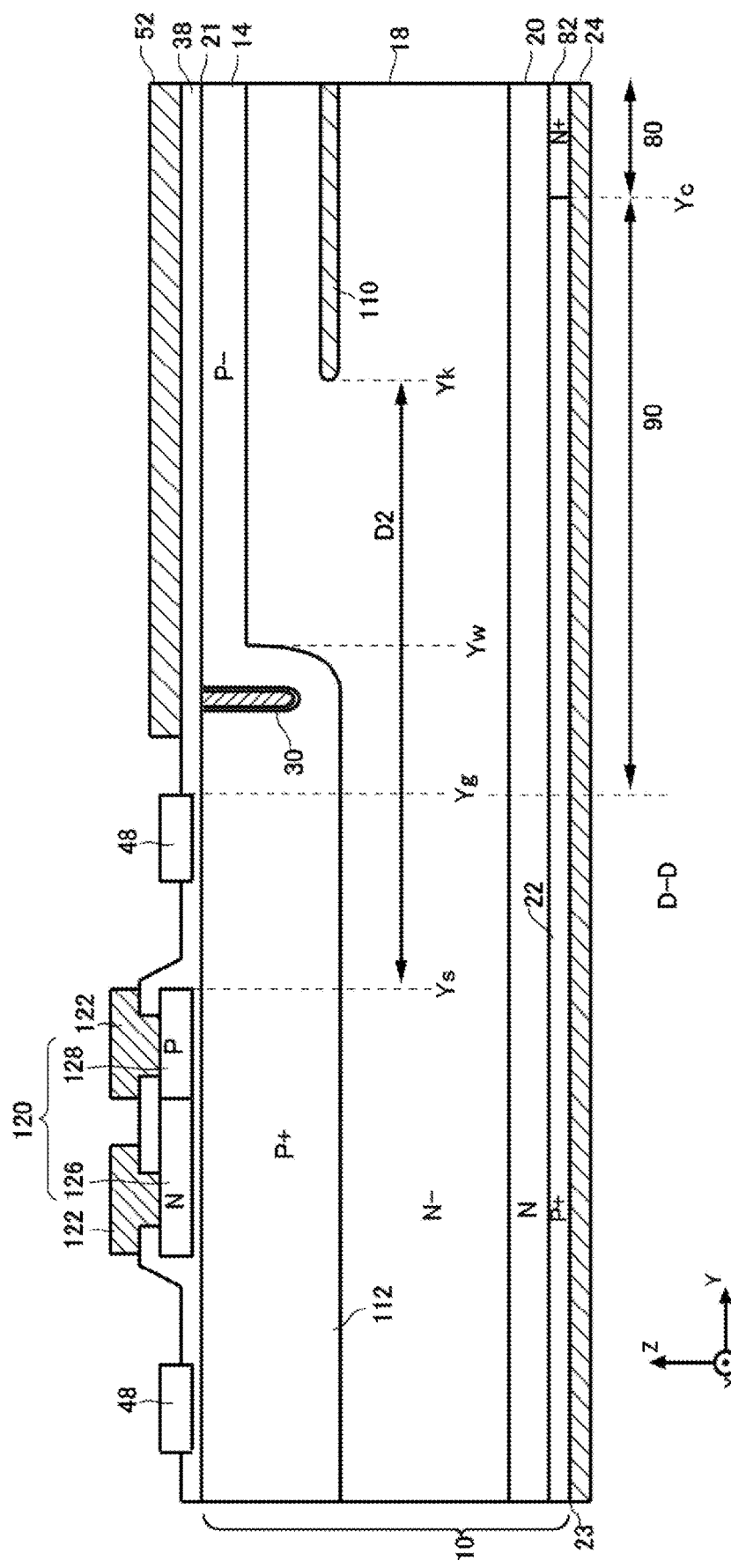
FIG. 6 illustrates one example of a cross section taken along D-D of FIG. 5.

FIG. 6 is a drawing illustrating one example a cross section taken along D-D. In the present example, the temperature sensing unit 120, the gate runner 48, and the emitter electrode 52 are provided above the upper surface 21 of the semiconductor substrate 10. Positions of the gate runners 48 may be disposed across the temperature sensing unit 120 in the Y-axis direction. The emitter electrode 52 is provided in the area not overlapping with the gate runner 48 and the temperature sensing unit 120. The well region 112 is provided below the gate runner 48 and the temperature sensing unit 120.

A boundary region 90 is provided between the gate runner 48 and the cathode region 82 in the Y-axis direction. The well region 112 is provided in the boundary region 90 between the cathode region 82 and the gate runner 48. The well region 112 of the boundary region 90 may be continuous with the well region 112 below the temperature sensing unit 120. The boundary region 90 may include the end of the dummy trench portion 30 in the Y-axis direction. Further, in the boundary region 90, the interlayer dielectric film 38 may have a contact hole for connecting the emitter electrode 52 and the well region 112.

The upper lifetime control region 110 may be provided in at least a portion of the boundary region 90. The upper lifetime control region 110 in the boundary region 90 is continuous with the upper lifetime control region 110 in the diode section 80. By providing the upper lifetime control region 110 also in the boundary region 90, it is possible to adjust the lifetime of the carrier in the region near the diode section 80. On the other hand, the upper lifetime control region 110 is provided at the position not overlapping with the temperature sensing unit 120 in top view. Thereby, even if the irradiation with the lifetime killer is performed from the upper surface 21 side of the semiconductor substrate 10, it is possible to suppress the temperature sensing unit 120 from being irradiated with the lifetime killer.

In the present example, in the extending direction of the trench portion (Y-axis direction), the end position of the cathode region 82 closer to the temperature sensing unit 120 is defined as Yc, the end position of the upper lifetime control region 110 closer to the temperature sensing unit 120 is defined as Yk, the end position of the well region 112 closer to the position Yk is defined as Yw, the end position of the gate runner 48 closer to the position Yw is defined as Yg, and the end position of the temperature sensing unit 120 closer to the position Yw is defined as Ys.

The end position Yk of the upper lifetime control region 110 is between the end position Yc of the cathode region 82 and the end position Ys of the temperature sensing unit 120. The end position Yk of the upper lifetime control region 110 may be between the end position Yc of the cathode region 82 and the end position Yg of the gate runner 48. The end position Yk of the upper lifetime control region 110 may be between the end position Yw of the well region 112 and the end position Yg of the gate runner 48. The end position Yk of the upper lifetime control region 110 may be between the end position Ye of the cathode region 82 and the end position Yw of the well region 112.

The distance between the end position Yk of the upper lifetime control region 110 and the end position Ys of the temperature sensing unit 120 may be 90 µm or less in top view. By reducing the distance, it is possible to enlarge the area where the upper lifetime control region 110 is provided. The distance may be 10 µm or more and may be 50 µm or more. By securing the distance, it is possible to further suppress the temperature sensing unit 120 from being irradiated with the lifetime killer.

Figure 7:
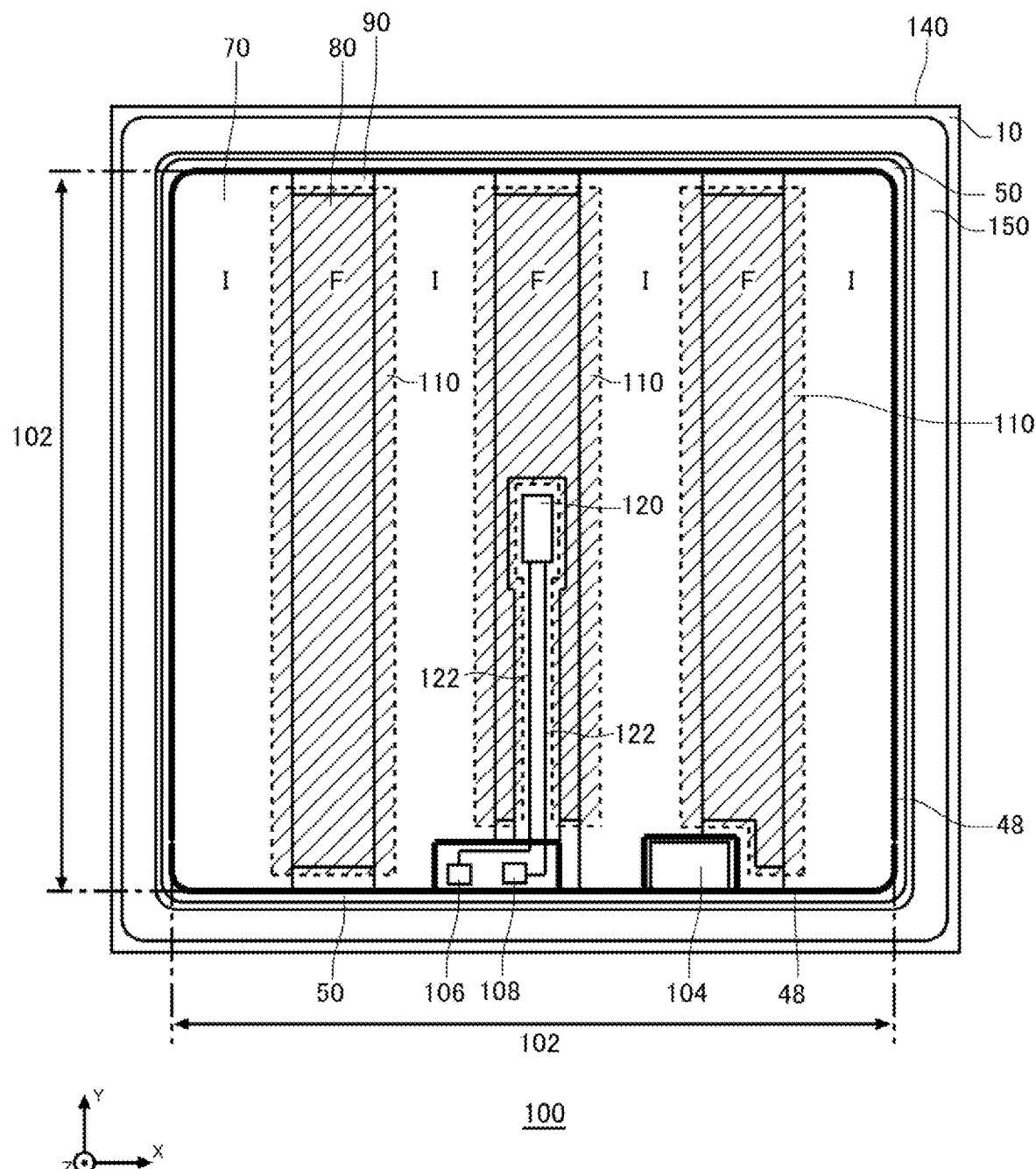
FIG. 7 illustrates another example of the upper surface structure of the semiconductor device 100.

FIG. 7 illustrates another example of an upper surface structure of a semiconductor device 100. The semiconductor device 100 of the present example differs from the semiconductor device 100 illustrated in FIG. 1 in that the diode sections 80 and the transistor sections 70 are alternately arrayed along the X-axis direction. Other structures are the same as those of the semiconductor device 100 illustrated in FIG. 1 to FIG. 3. As in the example of FIG. 1, the temperature sensing unit 120 of the present example is surrounded by a diode section 80 in top view. The temperature sensing unit 120 of the present example is surrounded by one of diode sections 80 discretely provided in the X-axis direction.

Each of the transistor section 70 and the diode section 80 is longer in the Y-axis direction and is shorter in the X-axis direction. The boundary region 90 may be provided between the diode section 80 and the gate runner 48 (or gate metal layer 50) in the Y-axis direction.

In the present example also, the gate runner 48 may surround the temperature sensing unit 120 and the temperature sensing wire 122 in top view. The gate runner 48 may divide the active section 102. Positional relationship among the upper lifetime control region 110, the cathode region 82, the well region 112, the gate runner 48, and the temperature sensing unit 120 may be similar to the positional relationship in the example illustrated in FIGS. 1 to 6.

Figure 8:
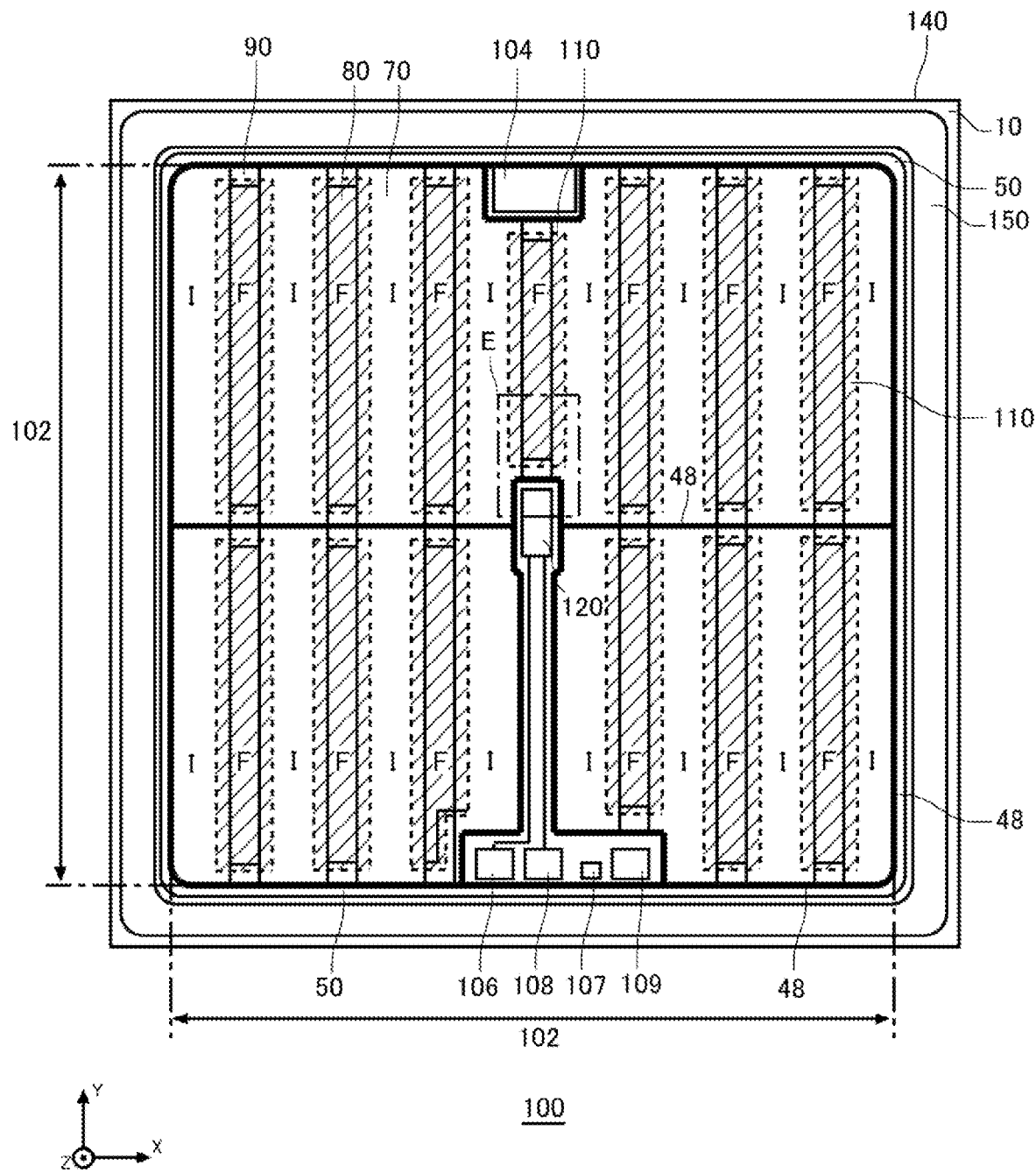
FIG. 8 illustrates another example of the upper surface structure of the semiconductor device 100.

FIG. 8 illustrates another example of an upper surface structure of a semiconductor device 100. In the active section 102 of the present example, the transistor sections 70 and the diode sections 80 are alternately arrayed in the X-axis direction as in the example of FIG. 4. The present example differs from the example of FIG. 4 in that the temperature sensing wire 122 extends in the Y-axis direction. The present example differs from the example of FIG. 4 in that the gate pad 104 is disposed across the active section 102 from the anode pad 106 and the cathode pad 108 in the Y-axis direction. Further, the present example differs from the example of FIG. 4 in that the temperature sensing unit 120 is longer in the Y-axis direction. Other structures may be similar to those of the semiconductor device 100 described in FIGS. 4 to 6.

The semiconductor device 100 of the present example includes a current sensing unit 107 and a current sensing pad 109. The current sensing unit 107 has a similar structure to the transistor section 70. The current sensing pad 109 detects a current flowing in the current sensing unit 107. A current flowing in the transistor section 70 can be estimated based on the area ratio of the current sensing unit 107 and the transistor section 70, and on the current flowing in the current sensing unit 107. The current sensing unit 107 and the current sensing pad 109 may be surrounded by the gate runner 48. A semiconductor device of another example may also include the current sensing unit 107 and the current sensing pad 109.

Figure 9:
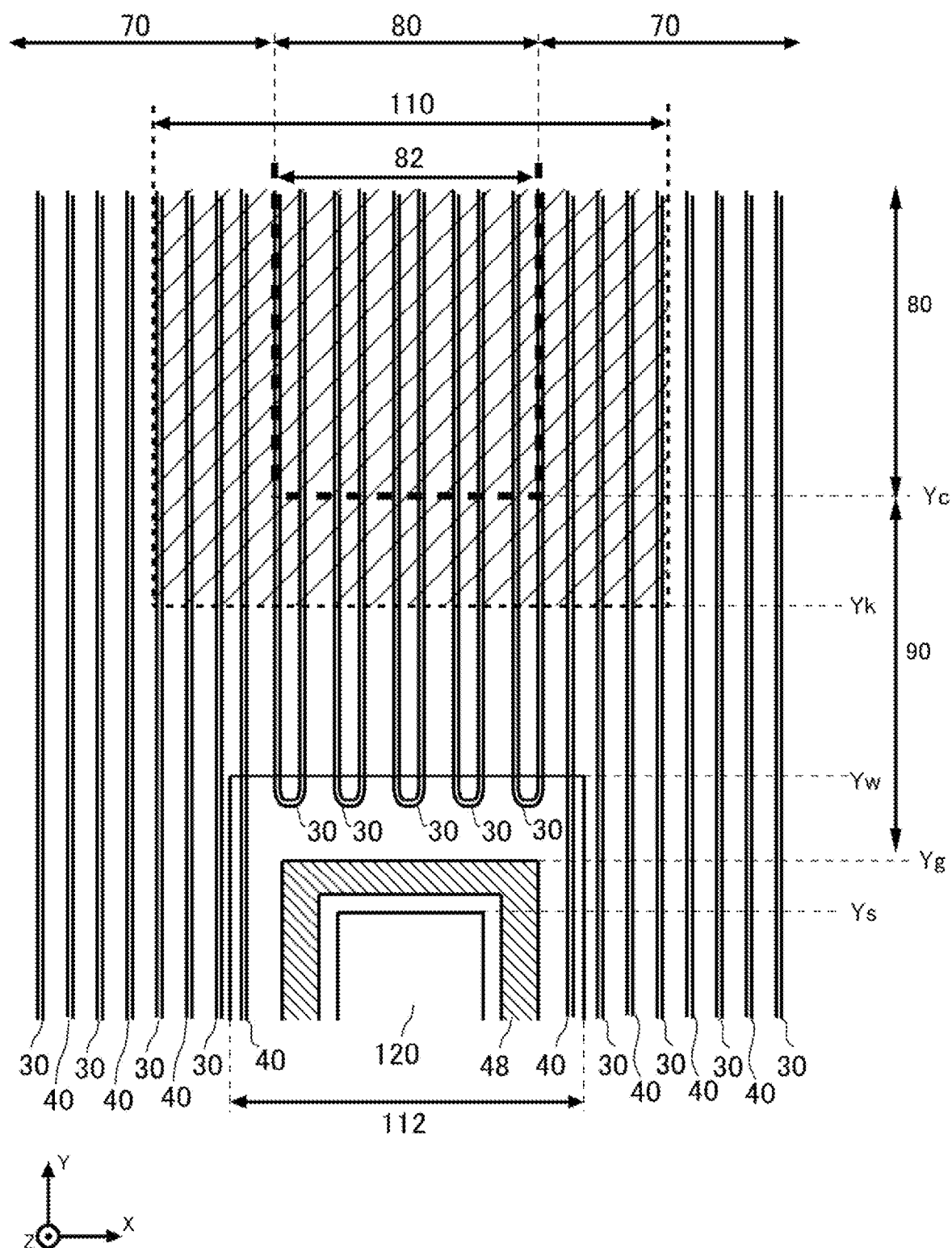
FIG. 9 is a top view obtained by enlarging a region E of FIG. 8.

FIG. 9 is a top view obtained by enlarging a region E in FIG. 8. The region E contains a part of the transistor section 70, a part of the diode section 80, and a part of the temperature sensing unit 120 as similar to the region A illustrated in FIG. 2. The temperature sensing unit 120 of the present example is adjacent to the diode section 80 in the Y-axis direction and is adjacent to the transistor section 70 in the X-axis direction. In the example of FIG. 9, the temperature sensing unit 120 is sandwiched by two transistor sections 70 in the X-axis direction. The boundary region 90 may be provided between the temperature sensing unit 120 and the transistor section 70. The above structure also allows accurate detection of the temperature of the diode section 80 and the transistor section 70. The positional relationship among the upper lifetime control region 110, the cathode region 82, the well region 112, the gate runner 48, and the temperature sensing unit 120 may be similar to the positional relationship in the example illustrated in FIGS. 1 to 7.

Figure 10:
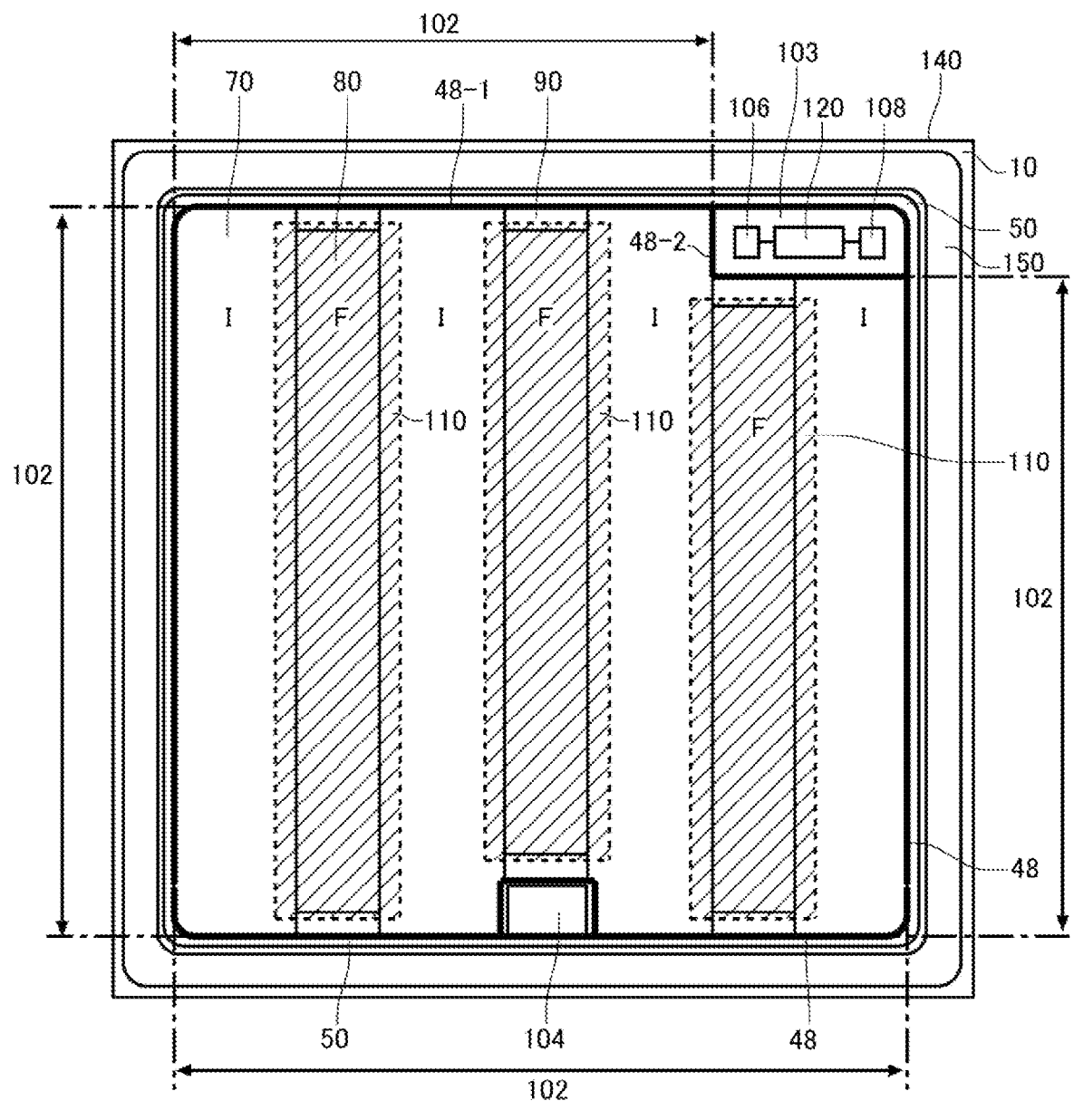
FIG. 10 illustrates another example of the upper surface structure of the semiconductor device 100.

FIG. 10 illustrates another example an upper surface structure of a semiconductor device 100. In the semiconductor device 100 of the present example, the temperature sensing unit 120 is provided between the active section 102 and the edge termination structure 150 in top view. The structure of the active section 102 is similar to the structure of the active section 102 of any aspect illustrated in FIGS. 4 to 9.

The gate runner 48 of the present example includes an outer peripheral portion 48-1 along the outer peripheral end 140 of the semiconductor substrate 10. The outer peripheral portion 48-1 has a substantially rectangular shape in top view. The outer peripheral portion 48-1 surrounds the active section 102 in top view. Corners of the rectangular-shaped outer peripheral portion 48-1 are curved. A region surrounded by the outer peripheral portion 48-1 in the gate runner 48 includes an inner portion 48-2 that defines a temperature sensing region 103 in which the temperature sensing unit 120 is provided. The temperature sensing unit 120 is provided in the temperature sensing region 103 surrounded by the outer peripheral portion 48-1 and the inner portion 48-2. The temperature sensing region 103 of the present example is between the active section 102 and the outer peripheral portion 48-1. The temperature sensing region 103 has neither the transistor section 70 nor the diode section 80. The temperature sensing region 103 may include the temperature sensing wire 122, the anode pad 106, and the cathode pad 108.

The temperature sensing unit 120 may be adjacent to the diode section 80. In the present example, the transistor sections 70 and the diode sections 80 are alternately arrayed in the X-axis direction. The temperature sensing region 103 is provided at the end of the active section 102 in the Y-axis direction. The temperature sensing unit 120 may be adjacent to the diode section 80 in the Y-axis direction. The temperature sensing unit 120 may also be adjacent to the transistor section 70 in the Y-axis direction. The temperature sensing unit 120 may be longer in the X-axis direction.

In the present example also, the upper lifetime control region 110 is provided in the diode section 80 and in a region not overlapping with the temperature sensing unit 120. The upper lifetime control region 110 may be provided in a region not overlapping with the inner portion 48-2 of the gate runner 48. The upper lifetime control region 110 may be provided in the region not overlapping with the well region 112 disposed below the inner portion 48-2 of the gate runner 48. The positional relationship among the upper lifetime control region 110, the cathode region 82, the well region 112, the gate runner 48, and the temperature sensing unit 120 may be similar to the example positional relationship illustrated in FIGS. 1 to 9.

Figure 11:
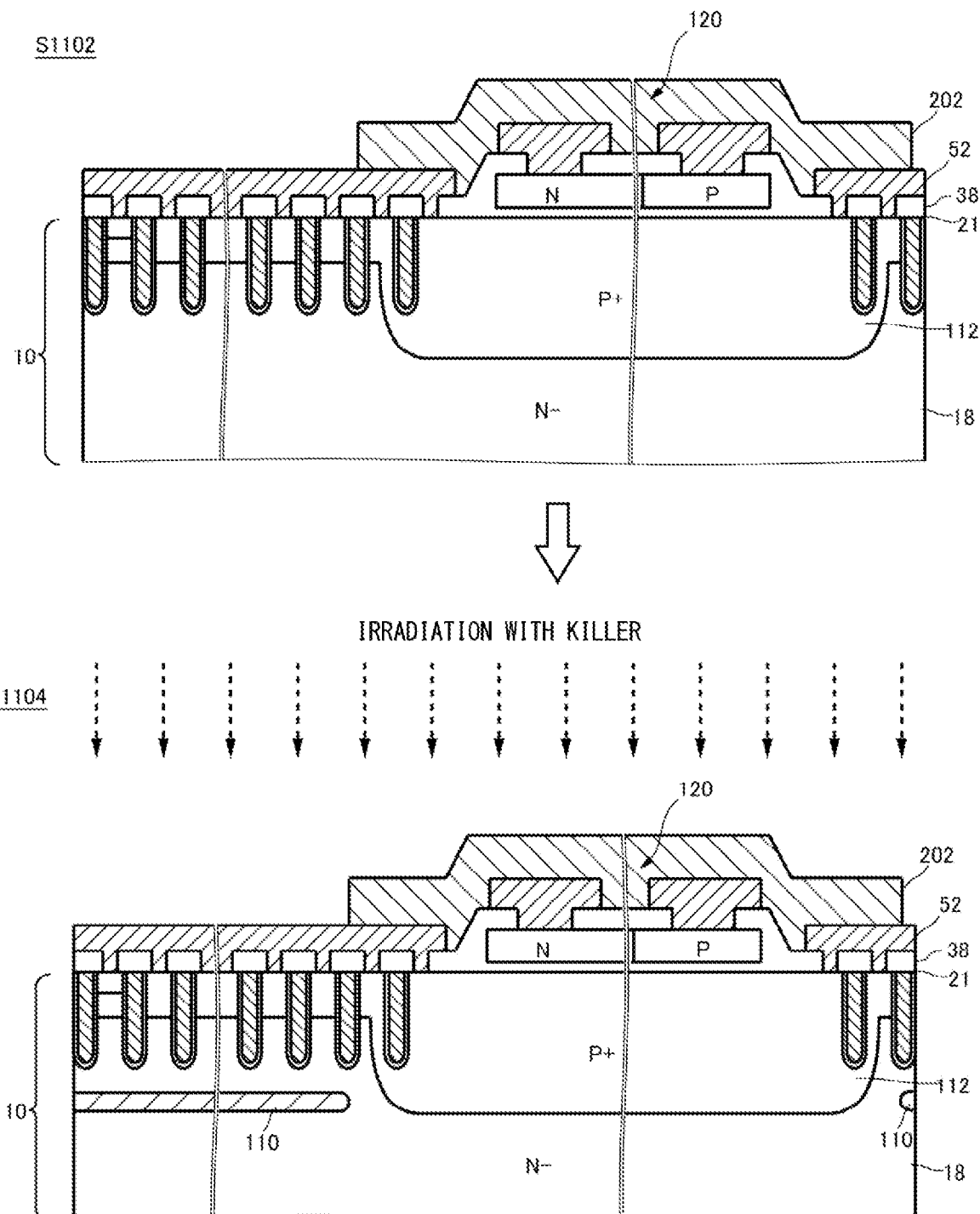
FIG. 11 illustrates one example of a fabrication method of the semiconductor device 100 illustrated in FIGS. 1 to 10.

FIG. 11 illustrates one example of a fabrication method of a semiconductor device 100 illustrated in FIGS. 1 to 10. The fabrication method of the present example includes a first step S1102 and a second step S1104. Before the first step S1102, structures on the upper surface 21 side of the semiconductor substrate 10 may be formed. The structure of the upper surface 21 side may include at least one of trenches, the emitter region 12, the contact region 15, the base region 14, the well region 112, the interlayer dielectric film 38 and the emitter electrode 52.

In the first step S1102, the temperature sensing unit 120 is formed above the semiconductor substrate 10. Also, in the first step S1102, a mask portion 202 that masks the temperature sensing unit 120 is formed. The mask portion 202 may be a photoresist formed on the temperature sensing unit 120. The mask portion 202 may be a metal mask disposed above the temperature sensing unit 120.

In the second step S1104, the upper lifetime control region 110 is formed in a region not overlapping with the temperature sensing unit 120 in top view by introducing the lifetime killer into the semiconductor substrate 10 from the upper surface 21 side and performing annealing. The mask portion 202 is removed after introducing the lifetime killer A structure of the lower surface 23 side of the semiconductor substrate 10 may be formed before the first step S1102 or after the second step S1104. The structure of the lower surface 23 side may include at least one of the buffer region 20, the collector region 22, the cathode region 82, and the collector electrode 24.

With the above method, the upper lifetime control region 110 illustrated in FIGS. 1 to 10 can be formed without implanting the lifetime killer into the temperature sensing unit 120.

Figure 12:
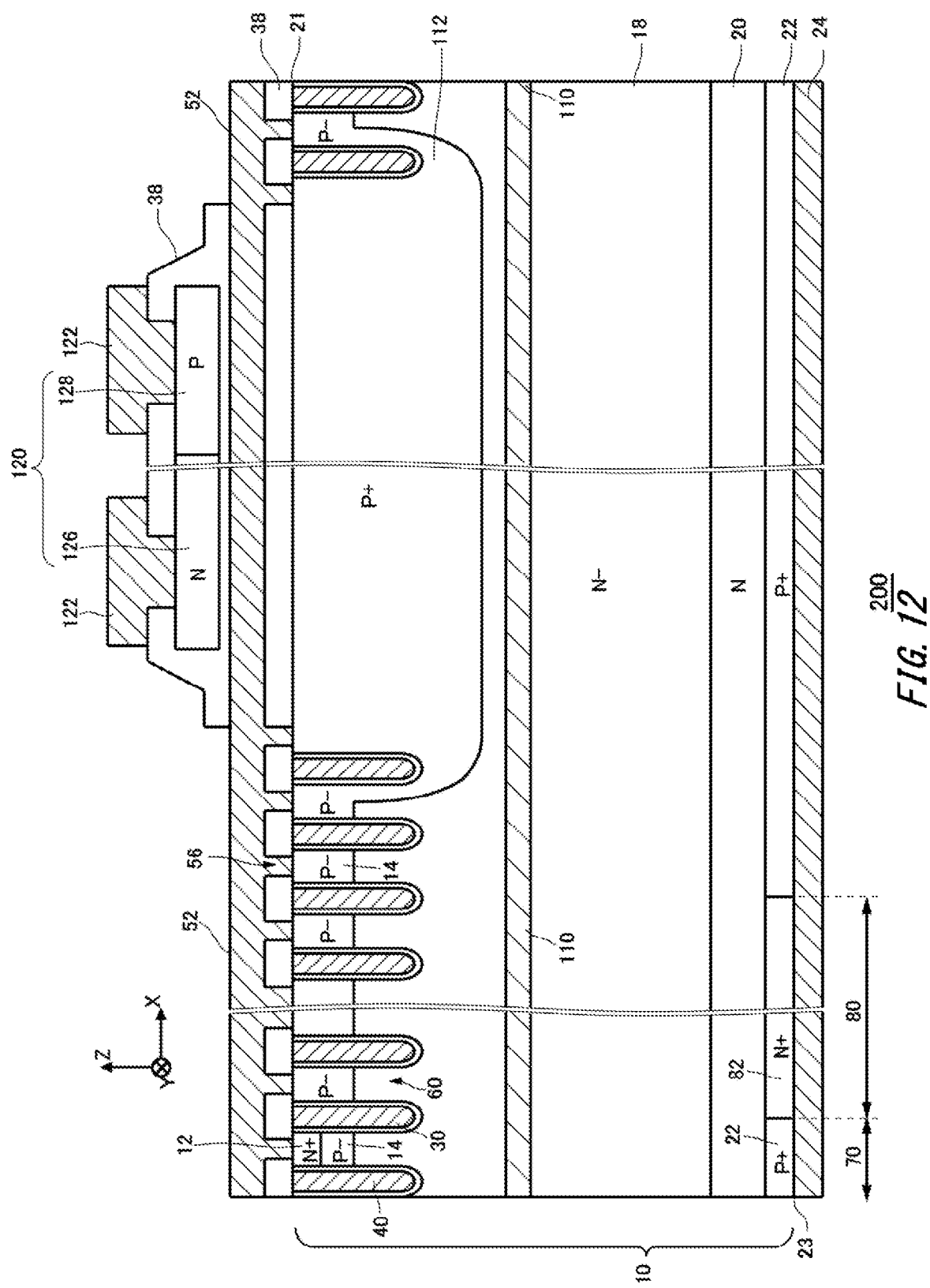
FIG. 12 is a cross sectional view illustrating one example of a semiconductor device 200.

FIG. 12 is a cross sectional view illustrating one example of a semiconductor device 200. The semiconductor device 200 of the present example may have the same structure as the semiconductor device 100 illustrated in FIGS. 1 to 11 except for the upper lifetime control region 110. While FIG. 12 illustrates a cross section similar to that in FIG. 3, the semiconductor device 200 may have the structures illustrated in the figures other than FIG. 3. In the present example, the emitter electrode 52 is disposed above the well region 112 and the temperature sensing unit 120 is disposed above the emitter electrode 52. In the example of each figure, the interlayer dielectric film 38 may be a stack of films formed through a plurality of processes.

A part of the upper lifetime control region 110 of the semiconductor device 200 is also provided in the region overlapping with the temperature sensing unit 120 in top view. The upper lifetime control region 110 below the temperature sensing unit 120 may be continuous with the upper lifetime control region 110 of the diode section 80. The temperature sensing unit 120 does not include the same lifetime killer as the upper lifetime control region 110. For example, while the upper lifetime control region 110 includes the lifetime killer such as helium, the temperature sensing unit 120 does not include the lifetime killer such as helium. With above structures also, it is possible to suppress the variation in characteristics of the temperature sensing unit 120.

The upper lifetime control region 110 may be formed at a position deeper than that of the lower end of the well region 112. In another example, the upper lifetime control region 110 may be formed at the same depth position as the well region 112. In this case, a part of the upper lifetime control region 110 is formed inside the well region 112.

Figure 13:
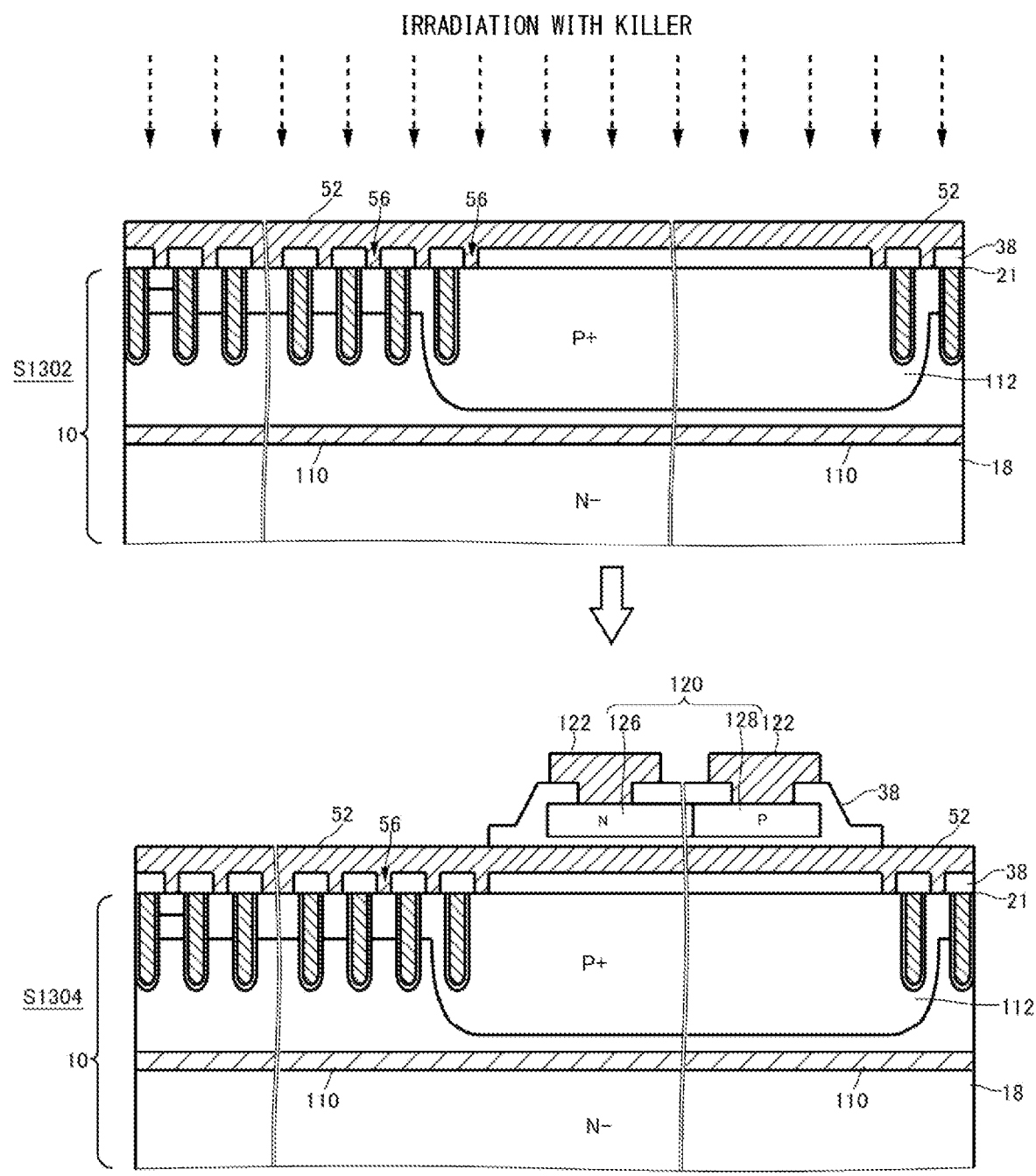
FIG. 13 illustrates one example of a fabrication method of the semiconductor device 200.

FIG. 13 illustrates one example of a fabrication method of a semiconductor device 200. The fabrication method of the present example includes a first step S1302 and a second step S1304. Before the first step S1302, a structure of the upper surface 21 side of the semiconductor substrate 10 may be formed. The structure of the upper surface 21 side may include at least one of each trench, the emitter region 12, the contact region 15, the base region 14, the well region 112, the interlayer dielectric film 38, and the emitter electrode 52.

In the first step S1302, the upper lifetime control region 110 is formed by introducing the lifetime killer to the semiconductor substrate 10 from the upper surface 21 side and performing annealing. A part of the upper lifetime control region 110 is formed below the region where the temperature sensing unit 120 is disposed. A part of the upper lifetime control region 110 of the present example is formed in the region overlapping with the well region 112 in top view. The upper lifetime control region 110 may overlap with the entire well region 112. The upper lifetime control region 110 may be formed in the entire active section 102.

In the second step S1104, the temperature sensing unit 120 is formed above the semiconductor substrate 10. The temperature sensing unit 120 is formed at the position overlapping with the upper lifetime control region 110 in top view. A protective film for covering the temperature sensing unit 120 may be formed after forming the temperature sensing unit 120.

A structure of the lower surface 23 side of the semiconductor substrate 10 may be formed before the first step S1102, between the first step S1102 and the second step S1104, or after the second step S1104. The structure of the lower surface 23 side may include at least one of the buffer region 20, the collector region 22, the cathode region 82, and the collector electrode 24.

Figure 14:
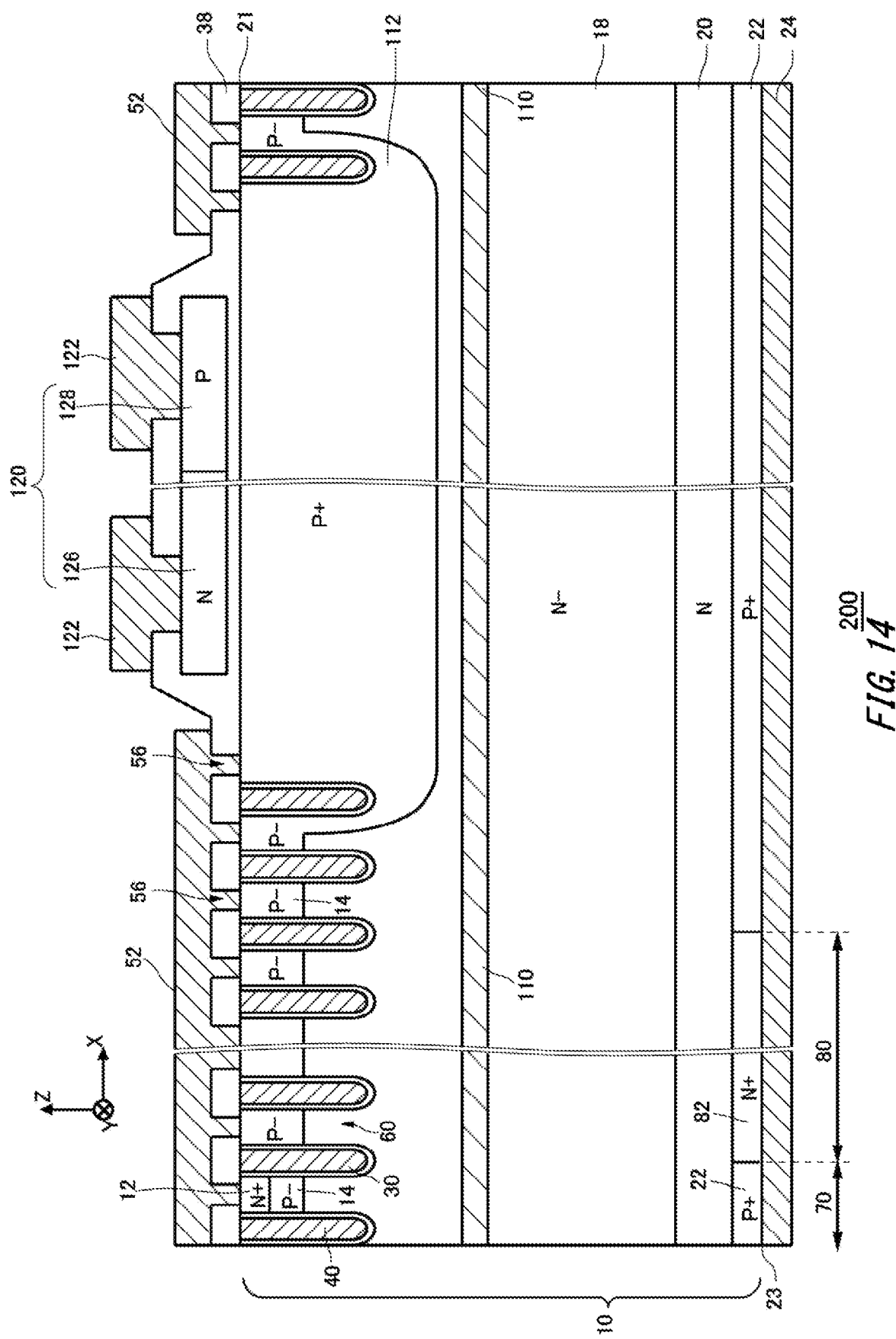
FIG. 14 is a cross sectional view illustrating another example of the semiconductor device 200.

FIG. 14 is a cross sectional view illustrating another example of a semiconductor device 200. In the semiconductor device 200 of the present example, a part of the upper lifetime control region 110 is provided in the region overlapping with the temperature sensing unit 120 in top view. Other structures are the same as those of the semiconductor device 100 illustrated in FIG. 3.

Figure 15:
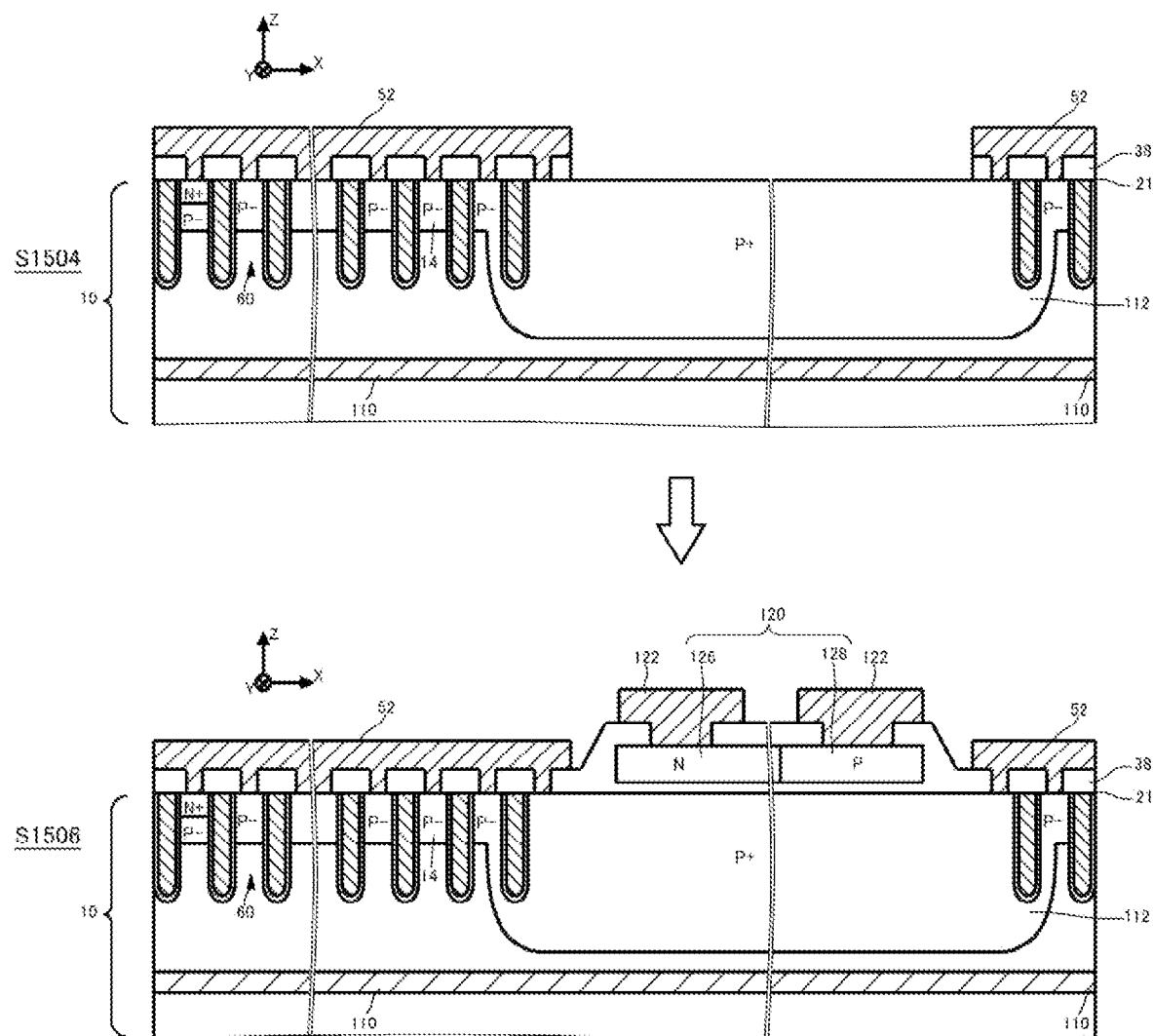
FIG. 15 illustrates one example of a fabrication method of the semiconductor device 200 illustrated in FIG. 14.

FIG. 15 illustrates one example of a fabrication method of the semiconductor device 200 illustrated in FIG. 14. The fabrication method of the present example also includes the first step S1302 of FIG. 13. In S1504 after S1302, the emitter electrode 52 and the interlayer dielectric film 38 in the region in which to form the temperature sensing unit 120 are etched. In the next second step S1506, the interlayer dielectric film 38, the temperature sensing unit 120, and the temperature sensing wire 122 are formed. Processes after the second step S1506 are the same as the processes in the example of FIG. 13.

Figure 16:
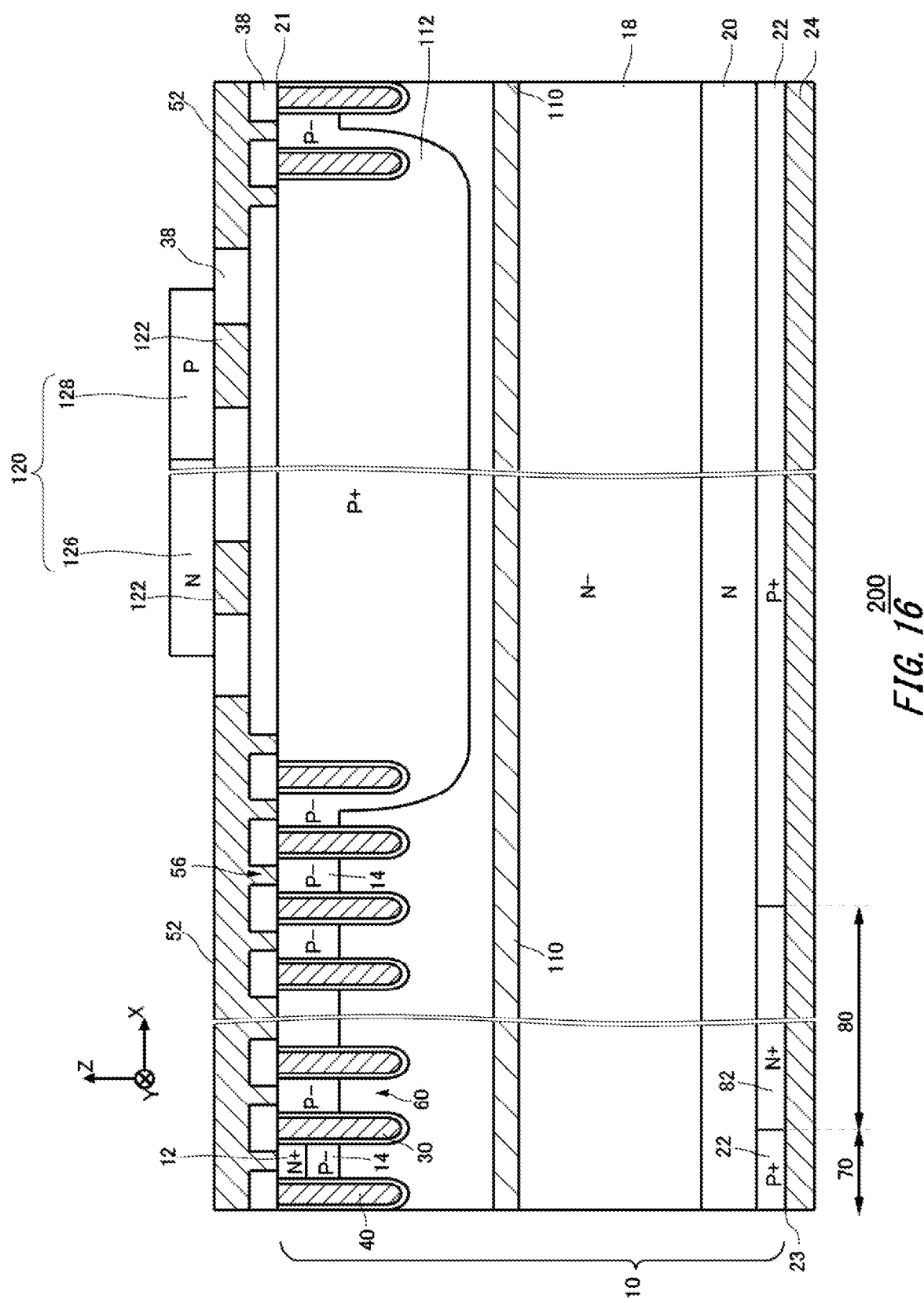
FIG. 16 is a cross sectional view illustrating another example of the semiconductor device 200.

FIG. 16 is a cross sectional view illustrating another example of a semiconductor device 200. The semiconductor device 200 of the present example includes the temperature sensing wire 122 between the interlayer dielectric film 38 and the temperature sensing unit 120. Other structures are the same as those of the semiconductor device 200 illustrated in FIGS. 12 to 15. The temperature sensing wire 122 may be formed through the same process as the emitter electrode 52. For example, the emitter electrode 52 formed in the first step S1302 of FIG. 13 may be patterned and a partial region may be used for the temperature sensing wire 122.

The temperature sensing wire 122 of the present example is formed of the same material as the emitter electrode 52. The temperature sensing wire 122 may be provided at the same depth position (position in Z-axis direction) as the emitter electrode 52. The interlayer dielectric film 38 is provided between the emitter electrode 52 and the temperature sensing wire 122. The interlayer dielectric film 38 may be provided in the region where the emitter electrode 52 is removed.

Figure 17:
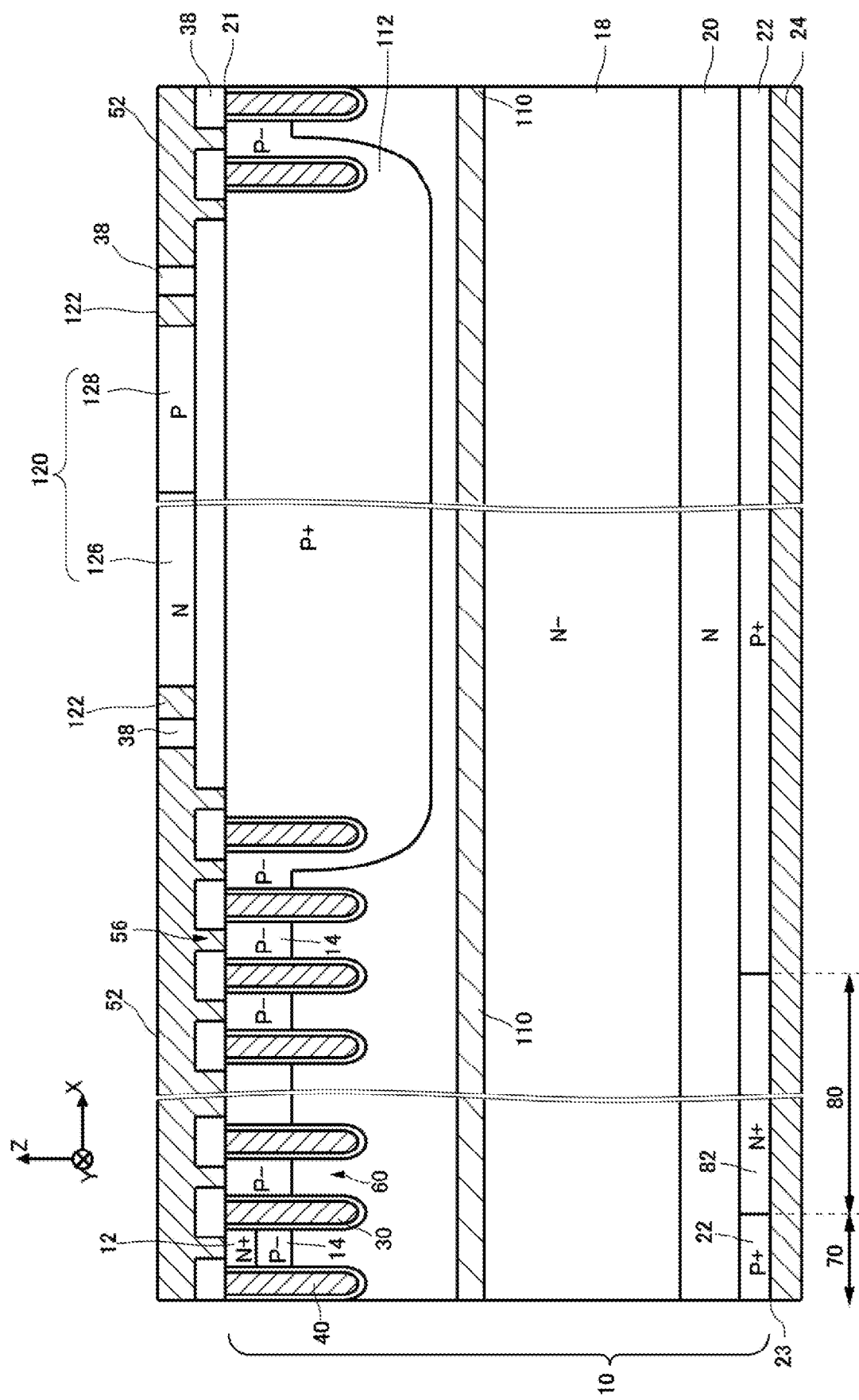
FIG. 17 is a cross sectional view illustrating another example of a semiconductor device 200.

FIG. 17 is a cross sectional view illustrating another example of a semiconductor device 200. In the semiconductor device 200 of the present example, the temperature sensing unit 120 and the temperature sensing wire 122 are in contact with each other in the direction parallel to the upper surface 21 of the semiconductor substrate 10 (for example, X-axis direction). Other structures are the same as those of the semiconductor device 200 illustrated in FIGS. 12 to 15. The temperature sensing wire 122 may be formed through the same processes as the emitter electrode 52. For example, the emitter electrode 52 formed in the first step S1302 of FIG. 13 is patterned and a partial region may be used for the temperature sensing wire 122.

The interlayer dielectric film 38 and the temperature sensing unit 120 are provided in the region where the emitter electrode 52 is removed. The temperature sensing wire 122 of the present example is formed of the same material as the emitter electrode 52. The temperature sensing wire 122 may be provided at the same depth position as the emitter electrode 52 (position in Z-axis direction). The temperature sensing unit 120, the emitter electrode 52, and the temperature sensing wire 122 may be provided at the same depth position. In the present example also, the interlayer dielectric film 38 is provided between the emitter electrode 52 and the temperature sensing wire 122. The interlayer dielectric film 38 may cover the temperature sensing wire 122.

In the semiconductor devices 200 illustrated in FIGS. 12 to 17, the upper lifetime control region 110 may be formed before forming the emitter electrode 52 and the temperature sensing unit 120 with polysilicon. In this case, the upper lifetime control region 110 may be formed by introducing the lifetime killer to the semiconductor substrate 10 from the upper surface 21 side and performing annealing after a portion of the interlayer dielectric film 38 (for example, a portion having the same thickness as the interlayer dielectric film 38 formed below the temperature sensing unit 120) is formed on the upper surface 21 of the semiconductor substrate 10.

With the above method, the upper lifetime control region 110 illustrated in FIG. 12 can be formed without implanting the lifetime killer into the temperature sensing unit 120. In the present example, the mask portion 202 is not used, and thus, the semiconductor device 200 can be fabricated through simple processes.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 12: emitter region, 14: base region, 15: contact region, 18: drift region, 20: buffer region, 21: upper surface, 22: collector region, 23: lower surface, 24: collector electrode, 30: dummy trench portion, 38: interlayer dielectric film, 40: gate trench portion, 48: gate runner, 48-1: outer peripheral portion, 48-2: inner portion, 50: gate metal layer, 52: emitter electrode, 56: contact hole, 60: mesa portion, 70: transistor section, 80: diode section, 82: cathode region, 90: boundary region, 100: semiconductor device, 102: active section, 103: temperature sensing region, 104: gate pad, 106: anode pad, 107: current sensing unit, 108: cathode pad, 109: current sensing pad, 110: upper lifetime control region, 112: well region, 120: temperature sensing unit, 122: temperature sensing wire, 126: N-type region, 128: P-type region, 140: outer peripheral end, 150: edge termination structure, 200: semiconductor device, 202: mask portion

What is claimed is:

1. A semiconductor device comprising:
    a semiconductor substrate including a first conductivity type drift region;
    an active section including a transistor section and a diode section provided on the semiconductor substrate;
    an edge termination structure that is provided in the semiconductor substrate and surrounds the active section in top view;
    a second conductivity type well region that is exposed at an upper surface of the semiconductor substrate;
    a temperature sensing unit that is provided at an outside of an outer periphery of the active section and between the outer periphery of the active section and the edge termination structure in top view and is provided above the well region; and
    an upper lifetime control region that is provided in the diode section and at a side of the upper surface of the semiconductor substrate and is provided in a region not overlapping with the temperature sensing unit in top view.

2. The semiconductor device according to claim 1, wherein
    a distance between the temperature sensing unit and the upper lifetime control region in top view is 90 μm or less.

3. The semiconductor device according to claim 1, wherein
    the upper lifetime control region is provided in a region not overlapping with the well region in top view.

4. The semiconductor device according to claim 1, wherein
    the transistor section and the diode section include a trench portion that extends from a surface of the semiconductor substrate into the semiconductor substrate; and
    a portion of the trench portion is provided inside the well region.

5. The semiconductor device according to claim 1, wherein
    the diode section includes a second conductivity type cathode region that is provided inside the semiconductor substrate and is exposed at a lower surface of the semiconductor substrate; and
    an end of the upper lifetime control region is disposed between the cathode region and the temperature sensing unit in top view.

6. A semiconductor device comprising:
    a semiconductor substrate including a first conductivity type drift region;
    an active section including a transistor section and a diode section provided on the semiconductor substrate;
    an edge termination structure that is provided in the semiconductor substrate and surrounds the active section in top view;
    a second conductivity type well region that is exposed at an upper surface of the semiconductor substrate;
    a temperature sensing unit that is provided between the active section and the edge termination structure in top view and is provided above the well region; and
    an upper lifetime control region that is provided in the diode section and at a side of the upper surface of the semiconductor substrate and is provided in a region not overlapping with the temperature sensing unit in top view, wherein
    a distance between the temperature sensing unit and the upper lifetime control region in top view is 90 μm or less.

7. The semiconductor device according to claim 6, wherein
    the upper lifetime control region is provided in a region not overlapping with the well region in top view.

8. A semiconductor device comprising:
    a semiconductor substrate including a first conductivity type drift region;
    an active section including a transistor section and a diode section provided on the semiconductor substrate;
    an edge termination structure that is provided in the semiconductor substrate and surrounds the active section in top view;

a second conductivity type well region that is exposed at an upper surface of the semiconductor substrate;

a temperature sensing unit that is provided between the active section and the edge termination structure in top view and is provided above the well region; and an upper lifetime control region that is provided in the diode section and at a side of the upper surface of the semiconductor substrate and is provided in a region not overlapping with the temperature sensing unit in top view, wherein the transistor section and the diode section include a trench portion that extends from a surface of the semiconductor substrate into the semiconductor substrate; and a portion of the trench portion is provided inside the well region.

9. The semiconductor device according to claim 8, wherein the upper lifetime control region is provided in a region not overlapping with the well region in top view.

10. A semiconductor device comprising:

a semiconductor substrate including a first conductivity type drift region;

an active section including a transistor section and a diode section provided on the semiconductor substrate;

an edge termination structure that is provided in the semiconductor substrate and surrounds the active section in top view;

a second conductivity type well region that is exposed at an upper surface of the semiconductor substrate;

a temperature sensing unit that is provided between the active section and the edge termination structure in top view and is provided above the well region; and an upper lifetime control region that is provided in the diode section and at a side of the upper surface of the semiconductor substrate and is provided in a region not overlapping with the temperature sensing unit in top view, wherein the diode section includes a second conductivity type cathode region that is provided inside the semiconductor substrate and is exposed at a lower surface of the semiconductor substrate; and an end of the upper lifetime control region is disposed between the cathode region and the temperature sensing unit in top view.

11. The semiconductor device according to claim 10, wherein the upper lifetime control region is provided in a region not overlapping with the well region in top view.

* * * * *